(12) United States Patent
Rope et al.

(10) Patent No.: US 9,838,134 B1
(45) Date of Patent: Dec. 5, 2017

(54) OFF QUADRATURE MACH-ZEHNDER MODULATOR BIASING

(71) Applicant: INPHI CORPORATION, Santa Clara, CA (US)

(72) Inventors: Todd Rope, Santa Clara, CA (US); Radhakrishnan L. Nagarajan, Santa Clara, CA (US); Hari Shankar, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 38 days.

(21) Appl. No.: 14/984,849

(22) Filed: Dec. 30, 2015

Related U.S. Application Data

(63) Continuation-in-part of application No. 14/706,908, filed on May 7, 2015, now Pat. No. 9,323,128.

(51) Int. Cl.
  *G02F 1/01* (2006.01)
  *H04B 10/516* (2013.01)

(52) U.S. Cl.
  CPC .................................. *H04B 10/516* (2013.01)

(58) Field of Classification Search
  CPC ............ G02B 6/12007; G02B 6/12004; H04B 10/505; H04B 10/516; G02F 1/025; G02F 1/0147; G02F 1/225; G02F 1/0123; H01S 3/06716; H01S 3/06754
  USPC ........................................................ 385/1, 14
  See application file for complete search history.

(56) References Cited

U.S. PATENT DOCUMENTS

| | | | |
|---|---|---|---|
| 2003/0175037 A1* | 9/2003 | Kimmitt ................ | G02F 1/0123 398/198 |
| 2008/0138088 A1* | 6/2008 | Welch ..................... | H01S 5/026 398/183 |
| 2013/0215919 A1* | 8/2013 | Aflatouni ............ | H01S 5/06817 372/38.01 |
| 2015/0270905 A1* | 9/2015 | Rasmussen .......... | H04B 10/541 398/186 |

* cited by examiner

*Primary Examiner* — Jerry Blevins
(74) *Attorney, Agent, or Firm* — Richard T. Ogawa; Ogawa P.C.

(57) ABSTRACT

The present invention relates to telecommunication techniques and integrated circuit (IC) devices. More specifically, embodiments of the present invention provide an off-quadrature modulation system. Once an off-quadrature modulation position is determined, a ratio between DC power transfer amplitude and dither tone amplitude for a modulator is as a control loop target to stabilize off-quadrature modulation. DC power transfer amplitude is obtained by measuring and sampling the output of an optical modulator. Dither tone amplitude is obtained by measuring and sampling the modulator output and performing calculation using the optical modulator output values and corresponding dither tone values. There are other embodiments as well.

20 Claims, 27 Drawing Sheets

OFF QUADRATURE MACH-ZEHNDER MODULATOR BIASING

CROSS-REFERENCES TO RELATED APPLICATIONS

This application is a continuation-in-part application claiming priority to U.S. patent application Ser. No. 14/706,908, filed 7 May 2015, entitled "OFF QUADRATURE BIASING OF MACH ZEHNDER MODULATION FOR IMPROVED OSNR PERFORMANCE", which is incorporated by reference herein for all purposes.

BACKGROUND OF THE INVENTION

The present invention relates to telecommunication techniques and integrated circuit (IC) devices. More specifically, various embodiments of the present invention provide an integrated optical modulator device.

Over the last few decades, the use of communication networks has exploded. In the 10 early days of the Internet, popular applications were limited to emails, bulletin board, and mostly informational and text-based web page surfing, and the amount of data transferred was relatively small. Today, Internet and mobile applications demand a huge amount of bandwidth for transferring photo, video, music, and other multimedia files. For example, a social network like Facebook processes more than 500 TB of data daily. With such high demands on data and data 15 transfer, existing data communication systems need to be improved to address these needs.

CMOS technology is commonly used to design communication systems implementing Optical Fiber Links. As CMOS technology is scaled down to make circuits and systems run at higher speed and occupy smaller chip (die) area, the operating supply voltage is reduced for lower power consumption. Conventional FET transistors in deep-submicron CMOS processes 20 have very low breakdown voltage as a result the operating supply voltage is maintained around 1 Volt. The Photo-detectors (PD) used in 28G and 10G Optical Receivers require a bias voltage of more than 2 Volts across the anode and cathode nodes of the PD for better photo-current responsivity. These limitations provide significant challenges to the continued improvement of communication systems scaling and performance.

There have been many types of communication systems and methods. Unfortunately, they have been inadequate for various applications. Therefore, improved communication systems and methods are desired.

BRIEF SUMMARY OF THE INVENTION

The present invention relates to telecommunication techniques and integrated circuit (IC) devices. More specifically, embodiments of the present invention provide an off-quadrature modulation system. Once an off-quadrature modulation position is determined, a ratio between DC power transfer amplitude and dither tone amplitude for a modulator is as a control loop target to stabilize off-quadrature modulation. DC power transfer amplitude is obtained by measuring and sampling the output of an optical modulator. Dither tone amplitude is obtained by measuring and sampling the modulator output and performing calculation using the optical modulator output values and corresponding dither tone values. There are other embodiments as well.

According to an embodiment, the present invention provides a method for operating an off-quadrature modulation system. The method includes selecting at least a first input value for performing an optical modulation process. The method also includes generating a dither tone characterized by a first frequency. The method additionally includes generating a square-wave dither tone signal. The method further includes initiating a calibration process by interrupting a microcontroller unit using the square-wave dither tone signal. The method also includes initiating a timer using the square dither tone to track a first interval. The method further includes coupling the dither tone signal with a RF signal to form a driver signal. The method additionally includes performing the optical modulation process using the driver signal. Furthermore, the method includes generating a reference signal based by amplifying the dither tone signal. The method also includes monitoring a dump signal based on an output of the optical modulation process by the microcontroller unit. The method further includes obtaining N reference sample values during the first interval of K iterations by sampling the reference signal at a predetermined sampling grate. The method also includes storing the N reference sample values at a first buffer. The method additionally includes obtaining N measured sample values during a second interval of K iterations by sampling the dump signal at the predetermined sampling rate. The method further includes storing the N measured sample values at a second buffer. The method also includes calculating a first value by summing the N measured sample values. The method additionally includes calculating a second value by determining multiple of a dot product between the N reference sample values and the N measured sample values. The method also includes determining a first average value and a second average value by averaging the first values and the second values obtained over K iterations. The method also includes calculating a ratio between the first average value and the second average value. The method also includes adjusting at least the first input value using the ratio as a target of a control loop.

According to another embodiment, the present invention provides an off-quadrature biased optical modulation system. The system includes a driver module comprising a dither tone generator. The driver module is configured to output a reference dither tone signal and a driving signal. The driving signal includes an RF component and a dither tone component. The system also includes a light source. The system additionally includes an optical modulator that is configured to generate a modulated light signal and a dump signal using the light source and the driving signal. The system further includes an analog to digital converter (ADC) that is configured to sample the reference dither tone signal during a first time interval to generate N reference samples and to sample the dump signal during a second interval to generate N dump samples. The system also includes a first buffer that is configured to store the N reference samples. The system additionally includes a second buffer that is configured to store N dump samples. The system further includes a microcontroller unit that is configured to calculate a ratio based at least on the N reference samples and the N dump samples. The system further includes a control module that is configured to stabilize the optical modulator at off-quadrature positions using at least the ratio.

According to yet another embodiment, the present invention provides an off-quadrature biased optical modulation system that includes a driver module comprising a dither tone generator. The driver module is configured to output a dither tone signal and a driving signal. The driving signal includes an RF component and a dither tone component. The dither tone is characterized by a dither frequency. The system also includes a light source. The system additionally includes an optical modulator that is configured to generate a modulated light signal and a dump signal using the light source and the driving signal. The system also includes an analog to digital converter (ADC) that is configured to sample the dump signal to generate N dump samples. The system further includes a buffer that is configured to store N dump samples. The system additionally includes a memory for storing a lookup tables for storing dither values. The system further includes a microcontroller unit that is configured to calculate a ratio based at dither values and the N dump samples. The system further includes a control module that is configured to stabilize the optical modulator at off-quadrature positions using at least the ratio.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
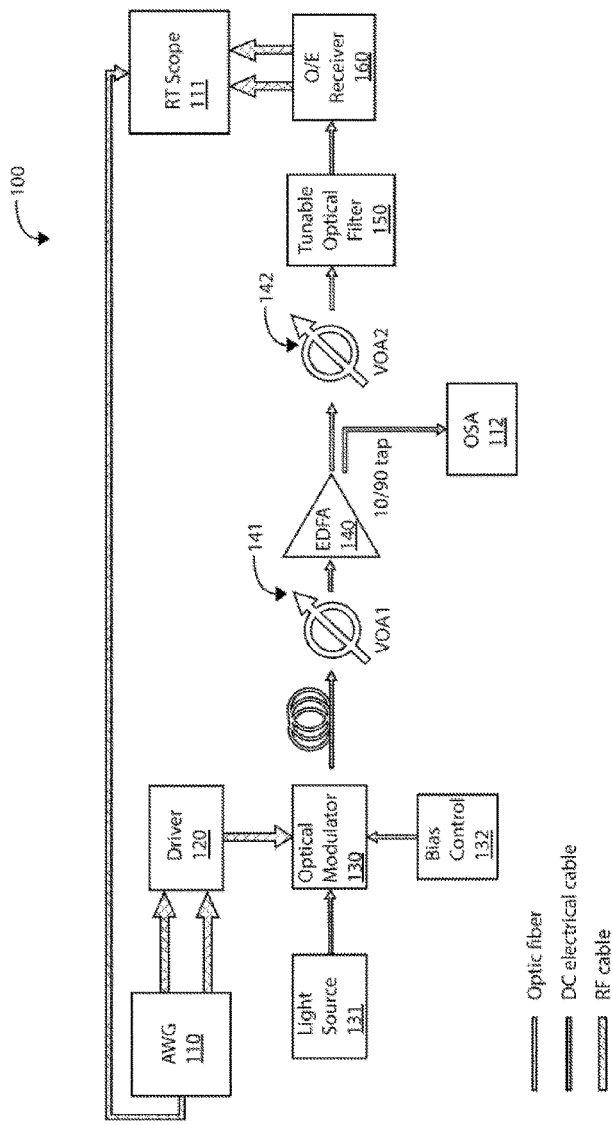
FIG. 1 is a simplified block diagram of an integrated optical modulator device according to an embodiment of the present invention.

The present invention relates to telecommunication techniques and integrated circuit (IC) devices. More specifically, embodiments of the present invention provide an off-quadrature modulation system. Once an off-quadrature modulation position is determined, a ratio between DC power transfer amplitude and dither tone amplitude for a modulator is as a control loop target to stabilize off-quadrature modulation. DC power transfer amplitude is obtained by measuring and sampling the output of an optical modulator. Dither tone amplitude is obtained by measuring and sampling the modulator output and performing calculation using the optical modulator output values and corresponding dither tone values. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

In optically amplified systems, a dominant noise source is the optical amplifier, which is typically an EDFA (Erbium Doped Fiber Amplifier) in DWDM (Dense Wavelength 15 Division Multiplexing) systems. The major component of the amplifier noise in such systems is the signal-spontaneous beat noise, which is due to the interference between the amplified signal and ASE (Amplified Spontaneous Emission). Considering that the noise power is relatively small in beat noise, this noise will dominate when the signal power is at its highest (e.g. highest light intensity). Conversely, if there is no signal, there is no beat noise.

In an example, the highest noise and largest eye closure happens at the top level for a 4-level PAM (Pulse-Amplitude Modulation) signal. More specifically, if the different levels of the PAM-4 (4-level PAM) signal are set up in an equally spaced configuration, the noise impacts the top level and leads to the greatest eye closure. However, if the individual levels can be reshaped such that the largest opening is at the top level, then the noise contribution between the various levels can be equalized to improve system performance. This technique can be applied to 4-level PAM systems, 8-level PAM systems, 16-level PAM systems, and the like.

As an example, the U.S. patent application Ser. No. 14/706,908 referenced above describes an off quadrature biasing technique with improved OSNR (Optical Signal-to-Noise Ratio). Off quadrature biasing is different from conventional modulator, such as an MZM (Mach-Zehnder Modulator) or the like, are typically biased at quadrature (50% point in a DC characteristic plot) to produce the maximum signal swing. However, by biasing the optical modulator off-quadrature and sacrificing a portion of the signal swing, the optical modulator exhibits a much improved OSNR.

FIG. 1 is a simplified block diagram of an integrated optical modulator device according to an embodiment of the present invention. This diagram is merely an example, which should not unduly limit the scope of the claims. One of ordinary skill in the art would recognize many variations, alternatives, and modifications. As shown, optical modulator device 100 is configured in a test configuration coupled to a signal generator 110 and an oscilloscope 111. The signal generator 110 can be configured to provide, by an RF cable, the oscilloscope 111 a 10 MHz reference signal, or other reference signal depending upon application. The signal generator 110 can be an AWG (Arbitrary Waveform Generator) 110, such as a 72 Gb/s AWG, or the like. The oscilloscope Ill can be an RT (Real-Time) scope, such as a 63 GHz RT Scope, or the like. This test configuration allows for testing of the optical modulator device by controlling inputs and recording outputs.

In an embodiment, the optical modulator device 100 can include a driver 120 coupled to an optical modulator 130. The driver 120 can be a differential input, single-ended output, variable gain, linear driver, which can receive a differential input from the AWG 110 by RF cables and transmit the signal output to the optical modulator 130. A light source 131 and a bias control module 132 can both be coupled to the optical modulator 130. In an example, the optical modulator 130 can be an MZM, or the like, and the light source 131 can be a laser module, an ITLA (Integrable Tunable Laser Assembly), or the like.

In a specific embodiment, the optical modulator driver 120, the light source 131, and the bias control module 132 all feed inputs via interconnections to the optical modulator 130. The interconnection between the driver 120 and the optical modulator 130 can be an RF (Radio Frequency) cable and the interconnection between the bias control module 132 and the signal relay module 130 can be a DC (Direct Current) electrical cable. Also, the interconnection between the light source 131 and the optical modulator 130 can be an optical fiber cable.

In an embodiment, the optical modulator 130 can be coupled to an EDFA (Erbiumdoped Fiber Amplifier) 140, which can be coupled to a tunable optical filter 150. The optical filter 150 can be coupled to an O/E (Optical-to-Electrical) receiver 160. The O/E receiver 160 can be coupled to the oscilloscope 111. The interconnections from the 0/E receiver 160 can be RF cables providing a differential output to the scope 111. Also, an OSA (Optical Spectrum Analyzer) 112 can be coupled to the EDFA 140 to measure the EDF A parameters. The OSA 112 can be configured to the EDFA 140 by a 10/90 tap coupler, which directs 10% to the output and 90% to the gain medium.

In a specific embodiment, the signal relay module 130 can be coupled to a first VOA (Variable Optical Attenuator) 141 to the EDFA 140 and then to a second VOA 142, which is coupled to the tunable optical filter 150. The interconnections between these modules can be optical fibers characterized by 0, 10, or 20 km SMF (Single-Mode Fiber). Those of ordinary skill in the art will recognize other variations, modifications, and alternatives.

As described previously, as aspect of the present invention is to bias the optical modulator off-quadrature in order to obtain a much improved or optimal OSNR. The optical modulator 130 is characterized by a raised cosine or sine transfer function. This is to say that the DC transfer function of the modulator exhibits the behavior of a sinusoidal curve having phase characteristic of a cosine function with an average value or approximately 0.5.

In order to achieve the expansion of the top level in the PAM-4 signal example, a DC bias function can be applied via the bias control module 132 to the optical modulator. A method of expanding the top level of the PAM-4 signal is to apply a DC bias compression function to compress the lower levels of the PAM-4 signal. In a specific embodiment, this compression function is characterized by an inverse raised sine function, an inverse of the transfer function, or the like. In the DC transfer curve, this compression function squeezes the bottom half of the sinusoid curve, which can result in a more flattened trough.

Figure 2B:
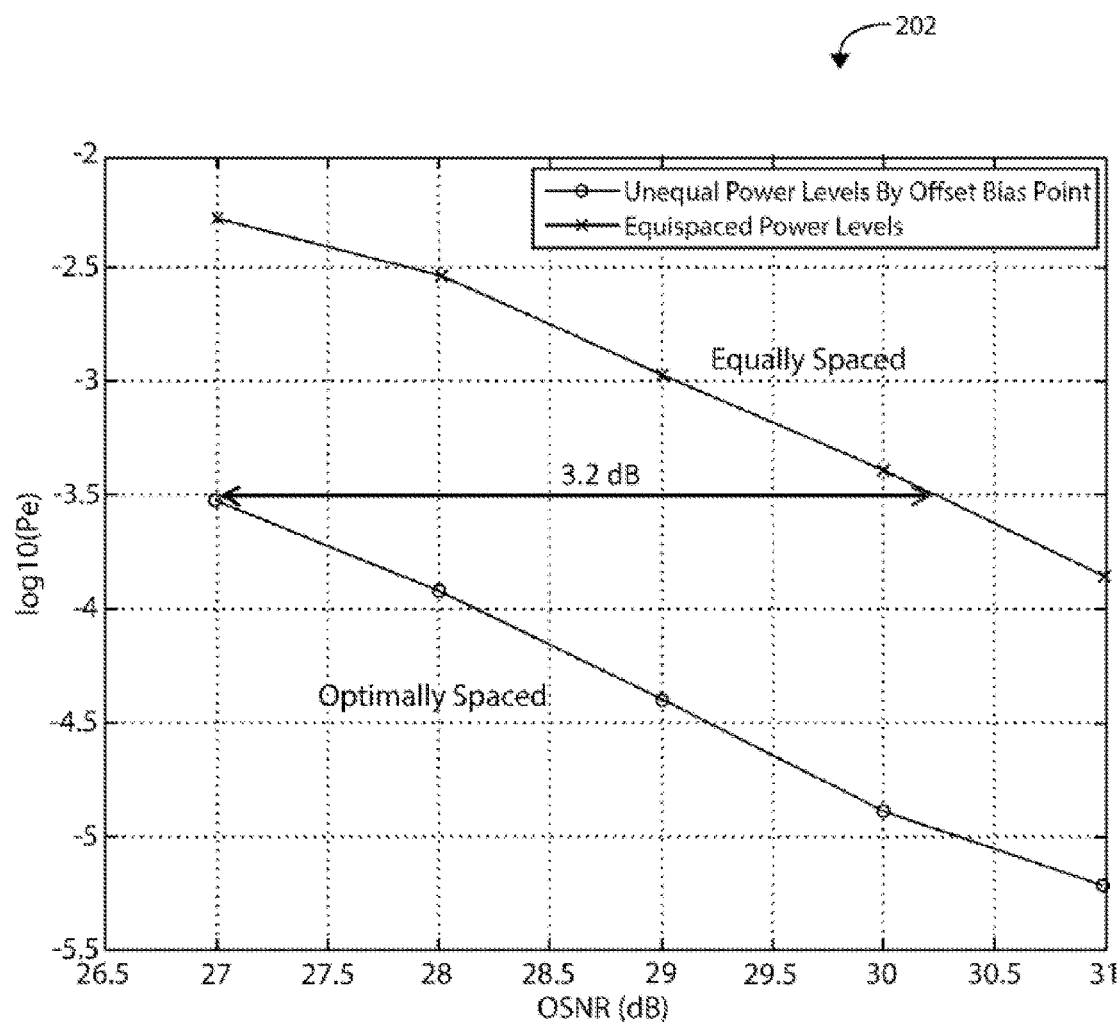
FIG. 2B is a simplified graph showing the OSNR (Optical Signal-to-Noise Ratio) for an off-quadrature biased optical modulator device and a quadrature biased optical modulator device according to an embodiment of the present invention.
Figure 3:
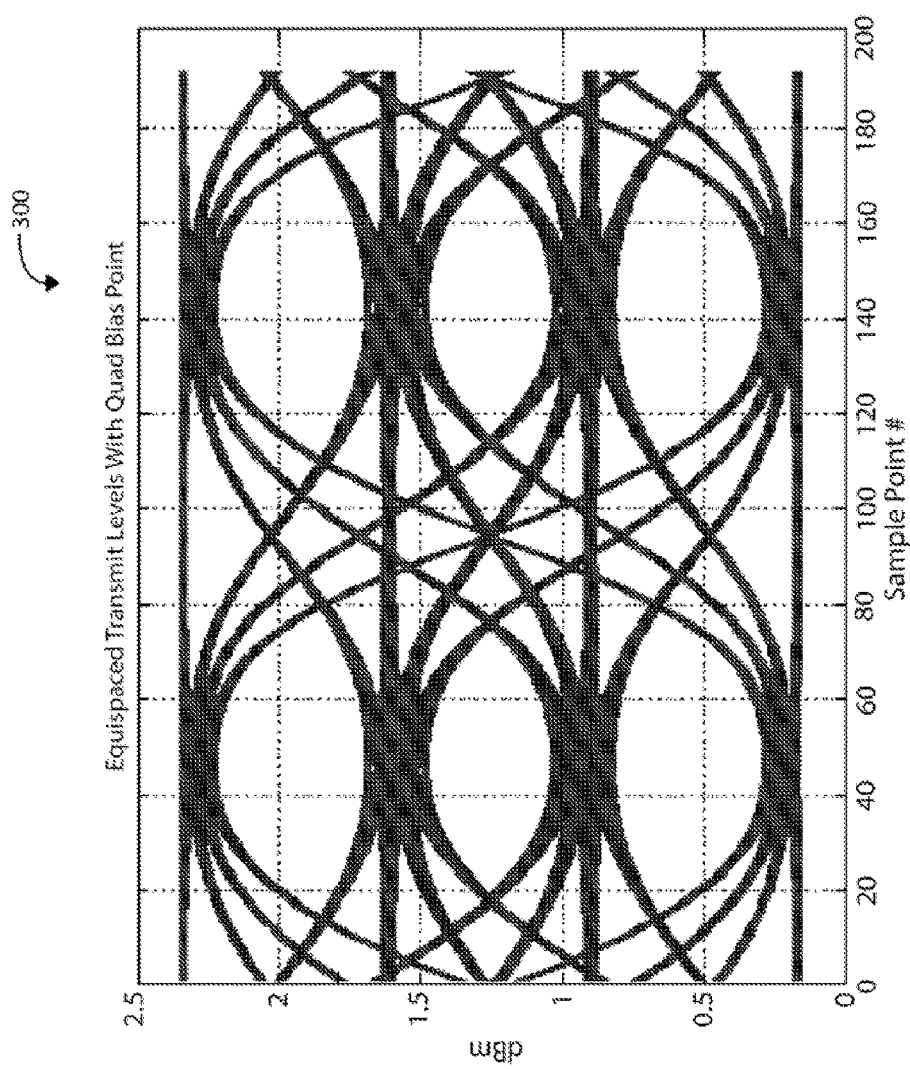
FIG. 3 is a simplified graph representing a signal output for a quadrature biased optical modulator device according to an embodiment of the present invention.
Figure 4:
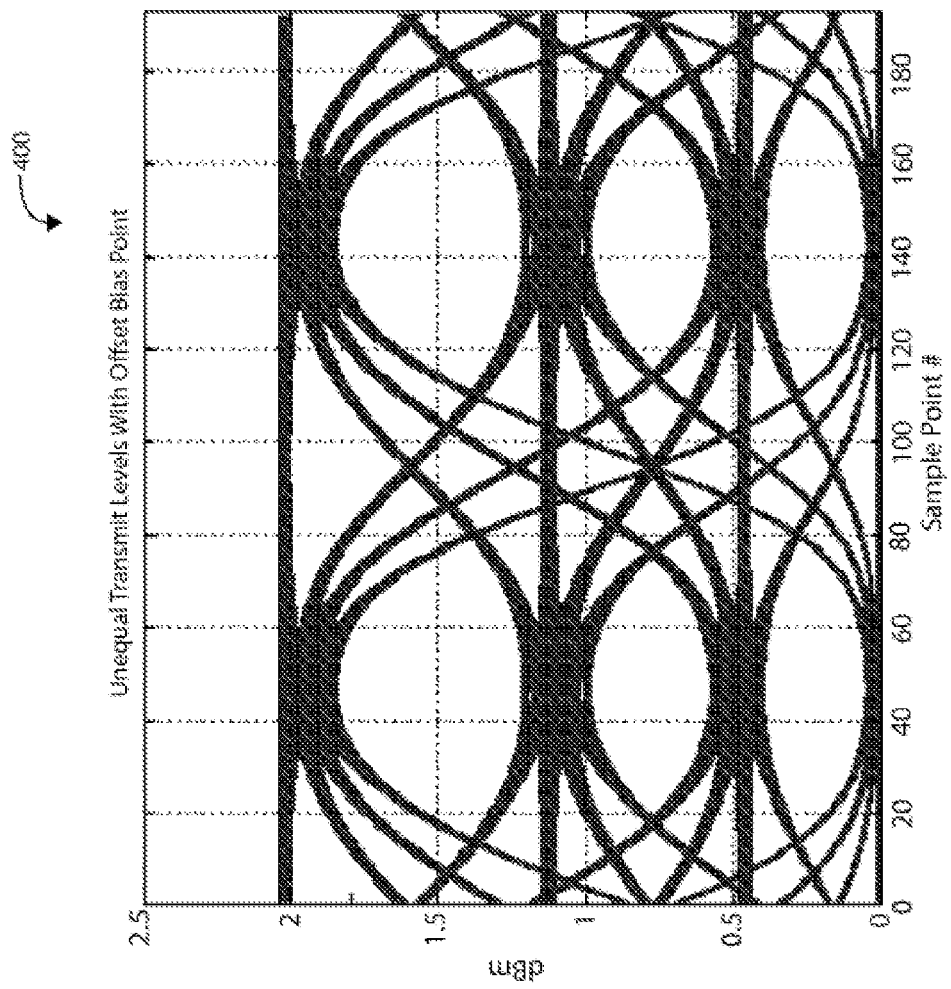
FIG. 4 is a simplified graph representing a signal output for an off-quadrature biased optical modulator device according to an embodiment of the present invention.

The result of this compression function is the compression of the bottom level of the PAM-4 signal and the expansion of the top level of the PAM-4 signal. This result is desirable due to the increased eye opening at the top level, which suffers from the most eye closure, and decreased eye opening at the bottom level, which suffers from the least eye closure. An example of the improvement to the OSNR of an optical modulator is shown in the graph of FIG. 2B. Additionally, FIGS. 3 and 4 show the characteristic difference in a PAM-4 signal between a quadrature biased optical modulator and an off-quadrature biased optical modulator according an embodiment of the present invention.

It is to be appreciated that embodiments of the present invention provide unequally divided eye levels provide compensation that optimizes optical transmission. For example, a feedback mechanism is used to determine what the optimal eye openings are. According to embodiments of the present invention, unequal eye opening are provided by the off quadrature biasing of the optical modulator. For example, once the optimal eye openings are determined, an off quadrature biasing mechanism of the optical modulator maintains the optimal eye openings, as described according to embodiments of the present invention.

Figure 2A:
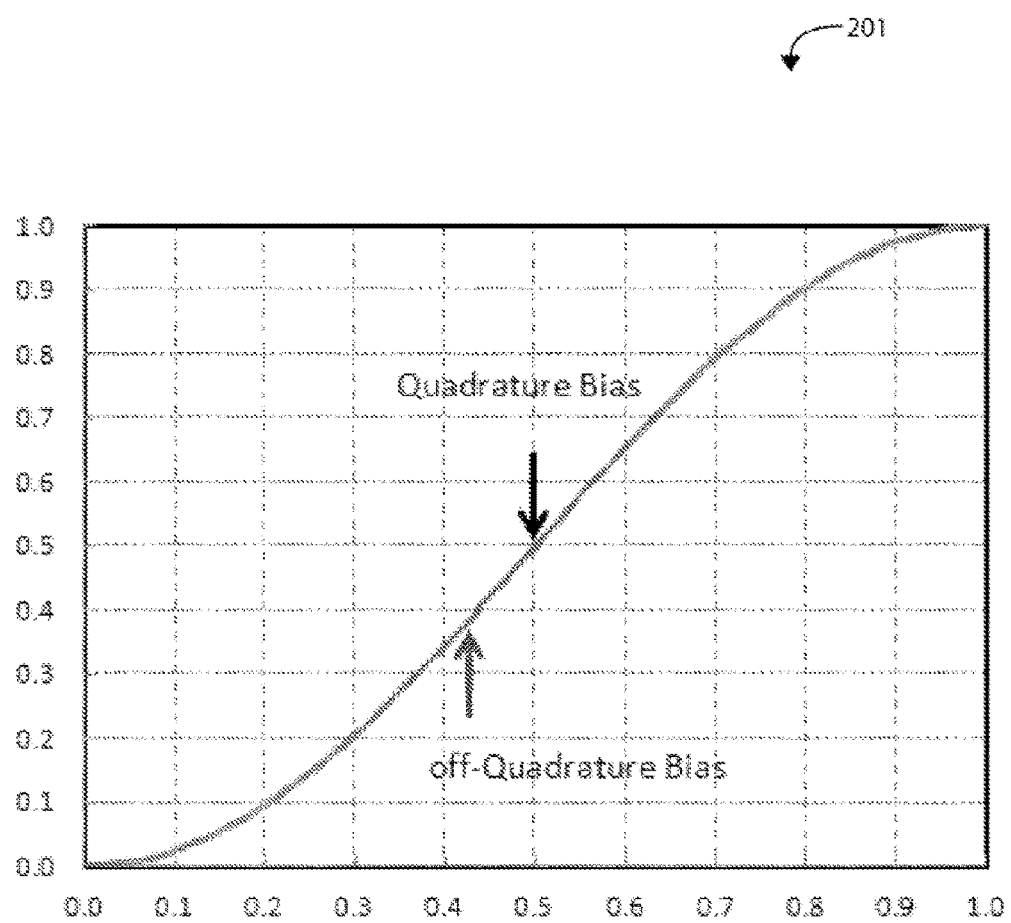
FIG. 2A is a simplified graph showing a comparison of quadrature bias versus off quadrature bias of a modulator transfer function for an optically amplified system according to an embodiment of the present invention.

FIG. 2A is a simplified graph showing a comparison of quadrature bias versus off quadrature bias of a modulator transfer function for an optically amplified system according to an embodiment of the present invention. Graph 201 illustrates a modulator transfer curve with a quadrature bias point and an off-quadrature bias point marked on the curve. As discussed previously, a bias compression function can be applied to an optical modulator to expand the top level of an optical signal (e.g. PAM-4) by compressing the bottom level. It is important to note that in biasing the optical modulator to expand the top signal level, the bias function must be towards the downwards direction or towards the null point, which is to compress the bottom or the troughs of the DC transfer curve. In applied in the upwards direction or the maximum transmission point, the top level would be compressed instead. This result is highly undesirable as there would be greater eye closure as the top level, which already suffers from the greatest eye closure.

FIG. 2B is a simplified graph showing the system Bit Error Rate vs. OSNR (Optical Signal-to-Noise Ratio) for an off-quadrature biased optical modulator device and a quadrature biased optical modulator device according to an embodiment of the present invention. As shown, the graph 202 displays bit error rate, labeled as log 10(Pe), over OSNR measured in dB (decibels). The "equispaced power levels configuration" is represented by the curve marked by "X", and the "unequal power levels by offset bias point" configuration is represented by the curve marked by "0". In this example, a 3.2 dB improvement in OSNR is obtained by use of the offset bias.

FIG. 3 is a simplified graph representing a signal output for a quadrature biased optical modulator device according to an embodiment of the present invention. As shown, the graph 300 shows an example PAM-4 (4-level Pulse Amplitude Modulation) signal according to the equispaced power levels configuration measured in dBm (decibel-milliwatts) over sample point number. Here, the PAM-4 signal displays four signal levels with three equally spaced eye opening regions. This is the characteristic behavior of a Mach Zehnder Modulator biased at quadrature. FIG. 3 can represent the "equispaced power levels" configuration of FIG. 2.

In order to determine the optimal bias function, the signal noise behavior for an optical modulator can be determined to minimize the noise at the top level. In a specific embodiment, the individual levels of an optical signal can be reshaped such that the largest eye opening is at the top level and the noise contribution between the various levels are equalized to improve overall system performance.

FIG. 4 is a simplified graph representing a signal output for an off-quadrature biased optical modulator device according to an embodiment of the present invention. As shown, the 20 graph 400 shows an example PAM4 signal according to the unequal power levels by offset bias point configuration. Here, the PAM4 signal displays four signal levels with three eye-openings with the top being expanded and the bottom being compressed. For example, FIG. 4 can represent the "unequal power levels" configuration of FIG. 2.

Figure 5:
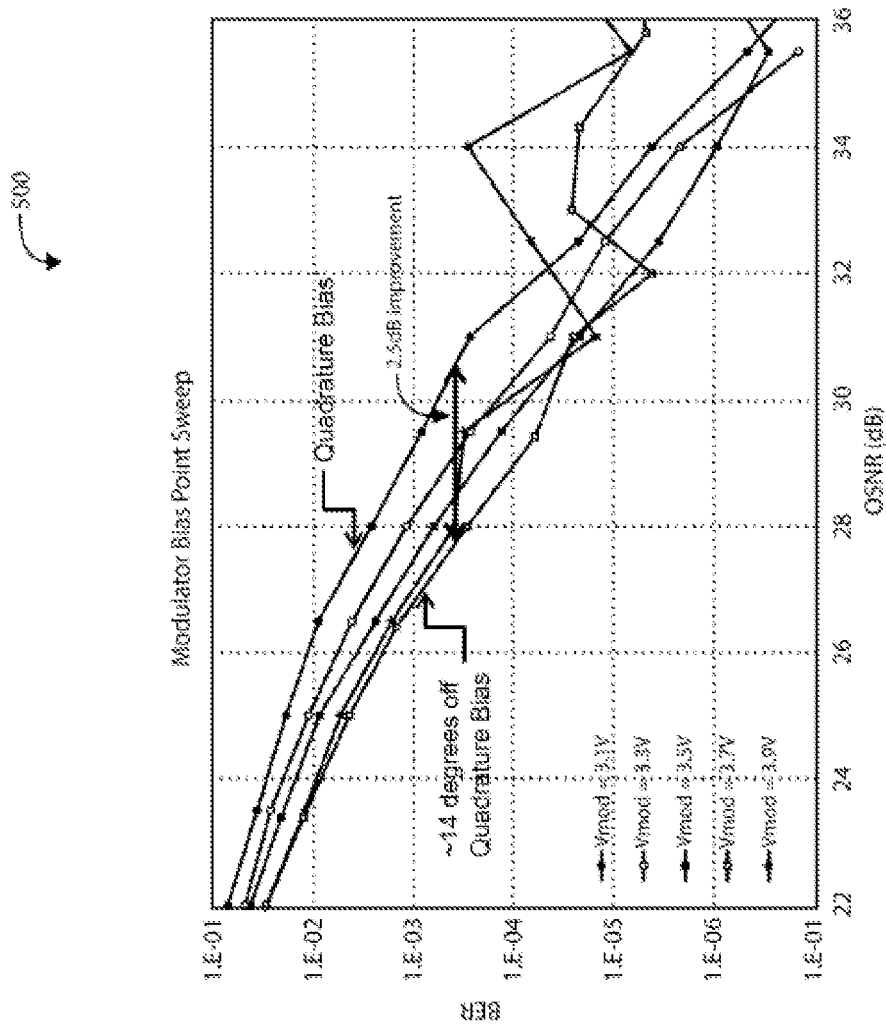
FIG. 5 is a simplified graph showing the OSNR for optical modulator devices configured at various bias points according to embodiments of the present invention.

FIG. 5 is a simplified graph showing the OSNR for optical modulator devices configured at various bias points according to embodiments of the present invention. As shown, the graph 500 shows the result from a modulator bias point sweep measuring BER (Bit Error Rate) over OSNR. Here, bias voltage levels from 3.1V to 3.9V are displayed with each test level represented in the key to the lower left of the graph. In this example, a 2.5 dB improvement over the quadrature bias was found in with an off-quadrature bias of about 14 degrees (corresponding to the 3.7V bias). The off-quadrature bias can be further optimized depending upon application.

As mentioned above, an optical modulator device according to embodiments of the present invention provides off-quadrature biasing. The device can include an MZM driver coupled to an MZM. The MZM is characterized by a raised cosine or sine transfer function and is configured for a PAM (Pulse Amplitude Modulation) signal having at least a top eye opening region and a bottom eye opening region. The MZM can be coupled to a light source and a bias control module, which is configured to apply an off-quadrature bias to the optical modulator device. A first VOA is coupled to the MZM, and an EDFA is coupled to the first VOA and a second VOA. Also, a tunable optical filter can be coupled to the second VOA and an O/E receiver coupled to the filter the bias control module is configured to improve an OSNR of the optical modulator device by applying an off-quadrature bias to the optical modulator device. The bias control module is configured to apply the off-quadrature bias to the optical modulator device a DC compression function, which can be an inverse of the transfer function. This compression function is applied to the optical modulator in order to minimize a noise variance associated with the PAM signal. Furthermore, the bias control module is configured to apply an off-quadrature bias to the optical modulator such that the top eye opening is expanded and the bottom eye opening is compressed and a noise contribution associated with the noise variance for each level of the PAM signal is equalized.

In a specific embodiment, the MZM driver module is configured for a PAM-4 signal modulation characterized by four discrete pulse amplitude levels, including first through fourth amplitude levels, and three eye opening levels, including top, middle, and bottom eye openings. This MZM driver can be a differential input, single-ended output, variable gain, linear driver. Those of ordinary skill in the art will recognize other variations, modifications, and alternatives.

Many benefits are recognized through various embodiments of the present invention. Such benefits include improved system performance due to off-quadrature biasing of an optical modulator device. Embodiments of this off-quadrature bias configuration provide improvements to OSNR (Optical Signal-to-Noise Ratio) of an optical system. Other benefits will be recognized by those of ordinary skill in the art that the mechanisms described can be applied to other optical systems as well. The following description of figures provides additional information relating to an integrated optical system which can incorporate the optical modulator described previously.

Figure 6:
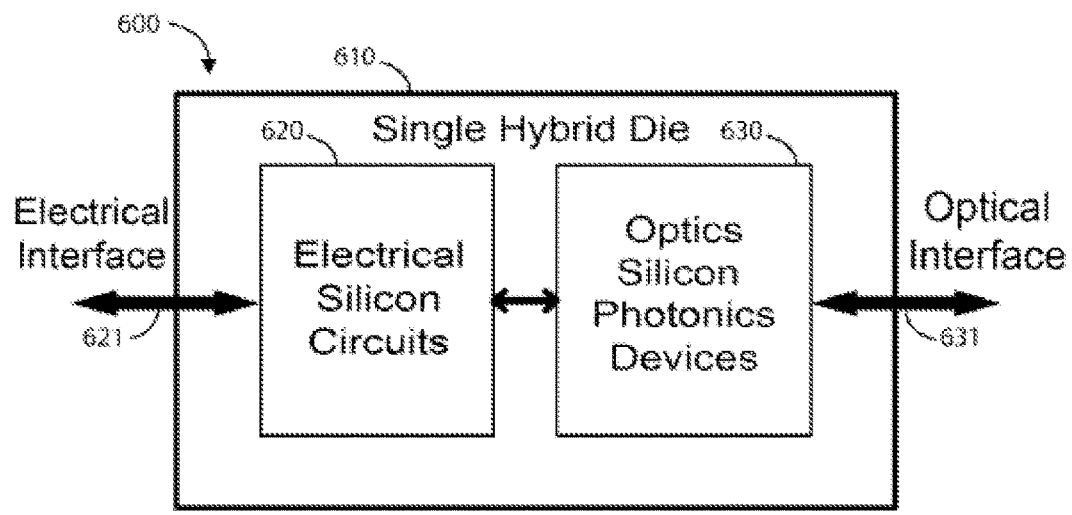
FIG. 6 is a simplified diagram of a single hybrid die (Both electrical and optics devices are fabricated on a single hybrid die) according to an embodiment of the present invention.

FIG. 6 is a simplified diagram of a single hybrid die (Both electrical and optics devices are fabricated on a single hybrid die) according to an embodiment of the present invention. In an example, the present device 600 comprises a single hybrid communication module made of silicon material. The module comprises a substrate member 610 having a surface region, an electrical silicon chip 620 overlying a first portion of the surface region, an silicon photonics device 630 overlying a second portion of the surface region, a communication bus coupled between the electrical silicon chip and the silicon photonics device, an optical interface 621 coupled to the silicon photonics device 630, and an electrical interface 621 coupled to the electrical silicon die 620.

Figure 7:
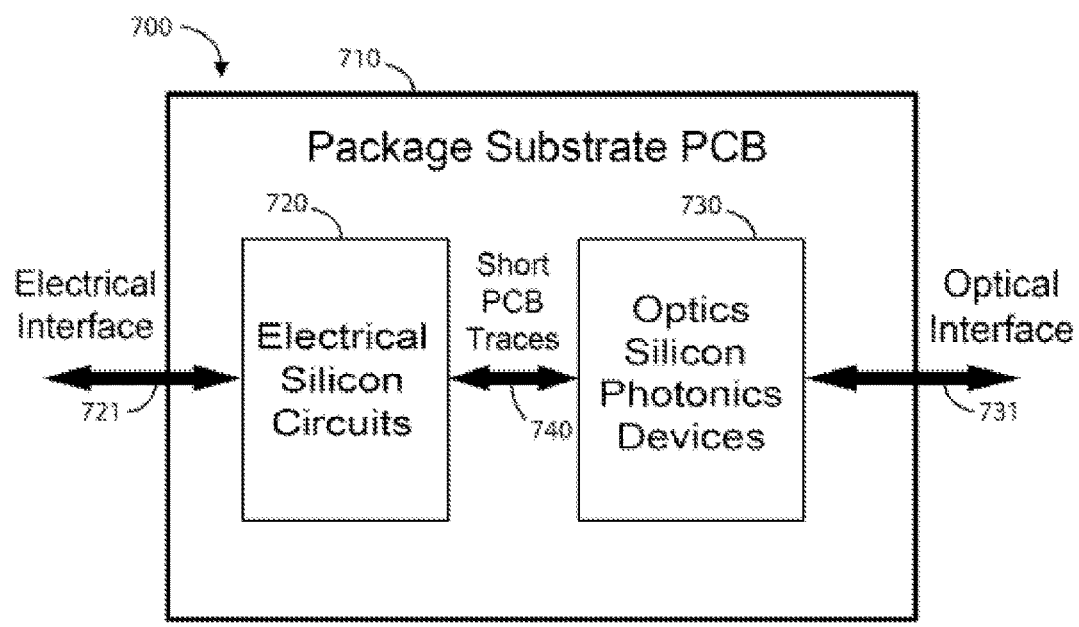
FIG. 7 is a simplified diagram of a multi-chip module according to an embodiment of the present invention.

FIG. 7 is a simplified diagram of a multi-chip module according to an embodiment of the present invention. In an example, the present device 700 comprises a single hybrid communication module. The module comprises a substrate member 710 having a surface region, which can be a printed circuit board or other member. The module comprises an electrical silicon chip 720 overlying a first portion of the surface region, a silicon photonics 730 device overlying a second portion of the surface region, a communication bus 740 coupled between the electrical silicon chip and the silicon photonics device, an optical interface 731 coupled to the silicon photonics device 730, and an electrical interface 721 coupled to the electrical silicon die 720.

Figure 8:
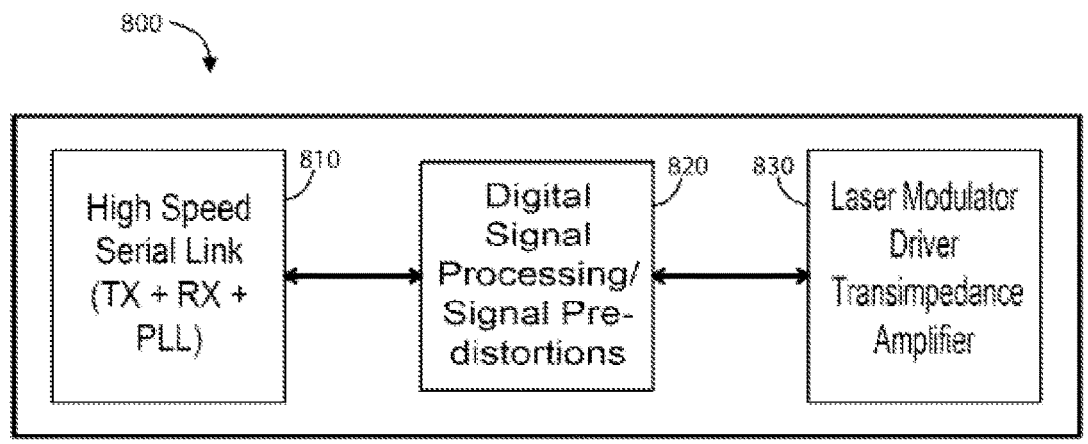
FIG. 8 is a simplified diagram of an electrical silicon die block according to an embodiment of the present invention.

FIG. 8 is a simplified diagram of an electrical silicon die block according to an embodiment of the present invention. As shown, the present device 800 can include a high speed serial link block 810, a digital signal processing/signal pre-distortion block 820, and a laser modulator driver transimpedance amplifier (TIA) 830, or other like devices. In an embodiment, the high speed serial link can include TX line, RX line, and PLL (Phase-Locked Loop) implementations. The serial link block 810 can be coupled to the signal processing module 820, which can be coupled to transimpedance amplifier 830.

Figure 9:
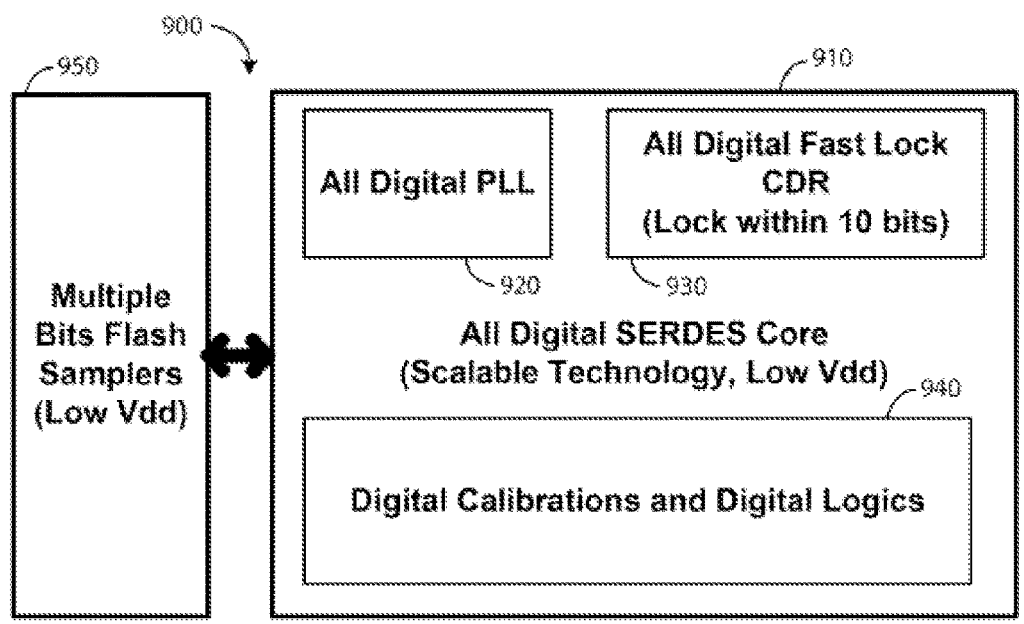
FIG. 9 is a simplified diagram of high speed serial link block according to an embodiment of the present invention.

FIG. 9 is a simplified diagram of high speed serial link block according to an embodiment of the present invention. As shown, the serial link block 900 can include a core 910, which can be an all-digital SERDES core. The core 910 can include an all-digital PLL 920, and all digital fast lock CDR 930 (Lock within 10 bits), and a digital calibrations and digital logics block 940. The core 910 can be coupled to multiple bits flash samplers 950. In a specific embodiment, the serial link block 810 of FIG. 8 can be configured like block 900.

Figure 10:
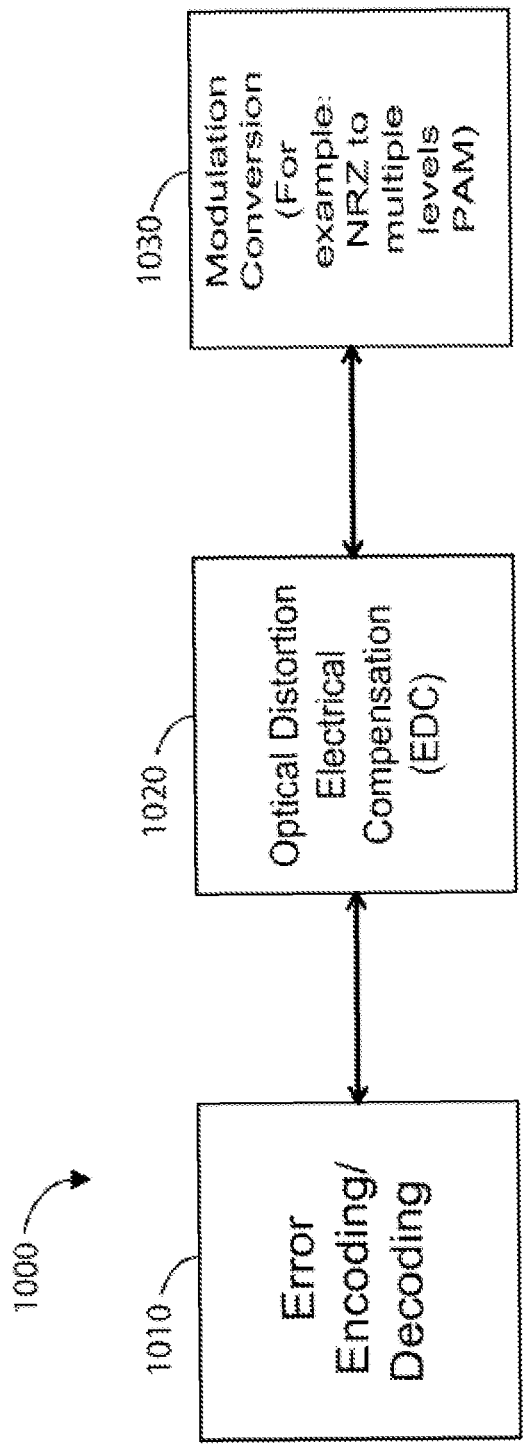
FIG. 10 is a simplified diagram of a digital processing/signal pre-distortion block according to an embodiment of the present invention.

FIG. 10 is a simplified diagram of a digital processing/signal pre-distortion block according to an embodiment of the present invention. As shown, the digital processing/signal pre-distortion block 1000 can include an error encoding/decoding block 1010, an optical distortion electrical compensation (EDC) block 1020, and a modulation conversion block 1030. In an embodiment, the encoding/decoding block 1010 can be coupled to the EDC block 1020, which is coupled to the modulation conversion block 1030. In a specific embodiment, the modulation conversion block 1030 can be configured to convert NRZ to multiple levels PAM. The TIA block 830 of FIG. 8 can be configured like block 1000.

Figure 11:
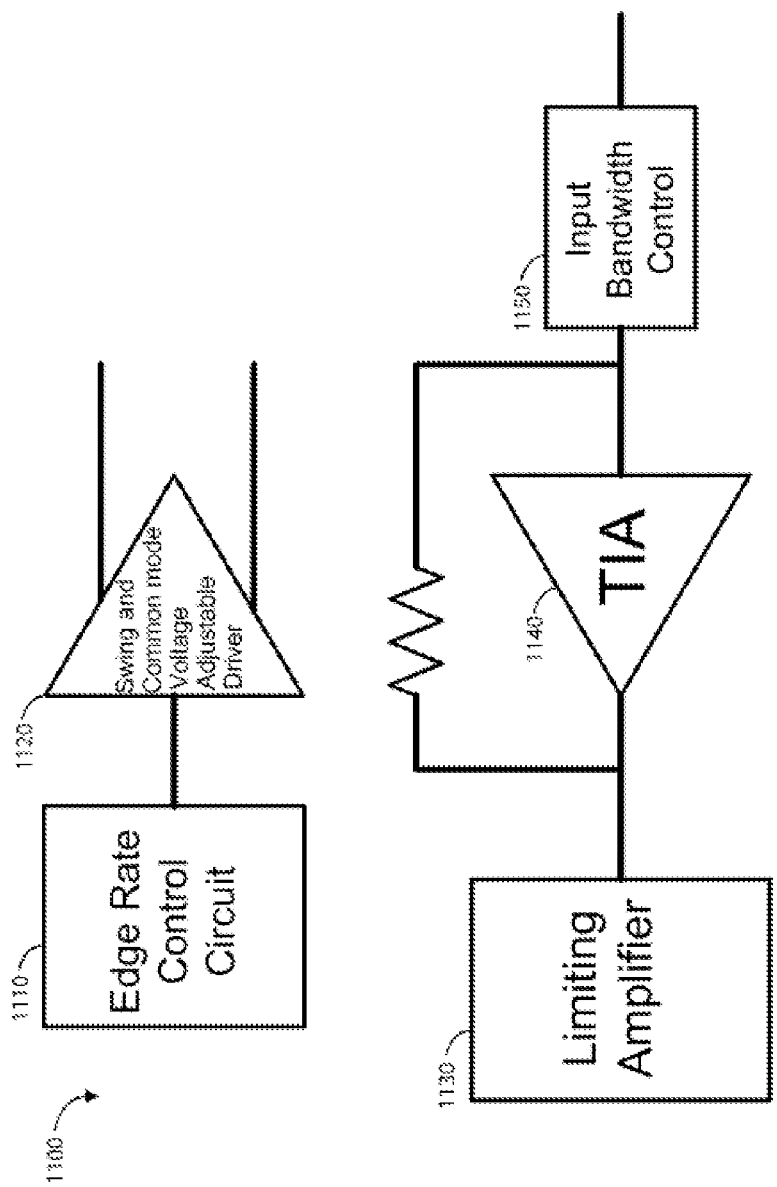
FIG. 11 is a simplified diagram of an electrical laser driver and TIA block diagram according to an embodiment of the present invention.

FIG. 11 is a simplified diagram of an electrical laser driver and TIA block diagram according to an embodiment of the present invention. As shown, the laser driver and TIA block 1100 can include an edge rate control circuit Ill 0 coupled to a swing and common mode voltage adjustable driver 1120. The driver and TIA block 1100 can also include a limiting amplifier 1130 coupled to a TIA 1140, which can be coupled to an input bandwidth control block 1150. Other configurations may be used as well.

Figure 12:
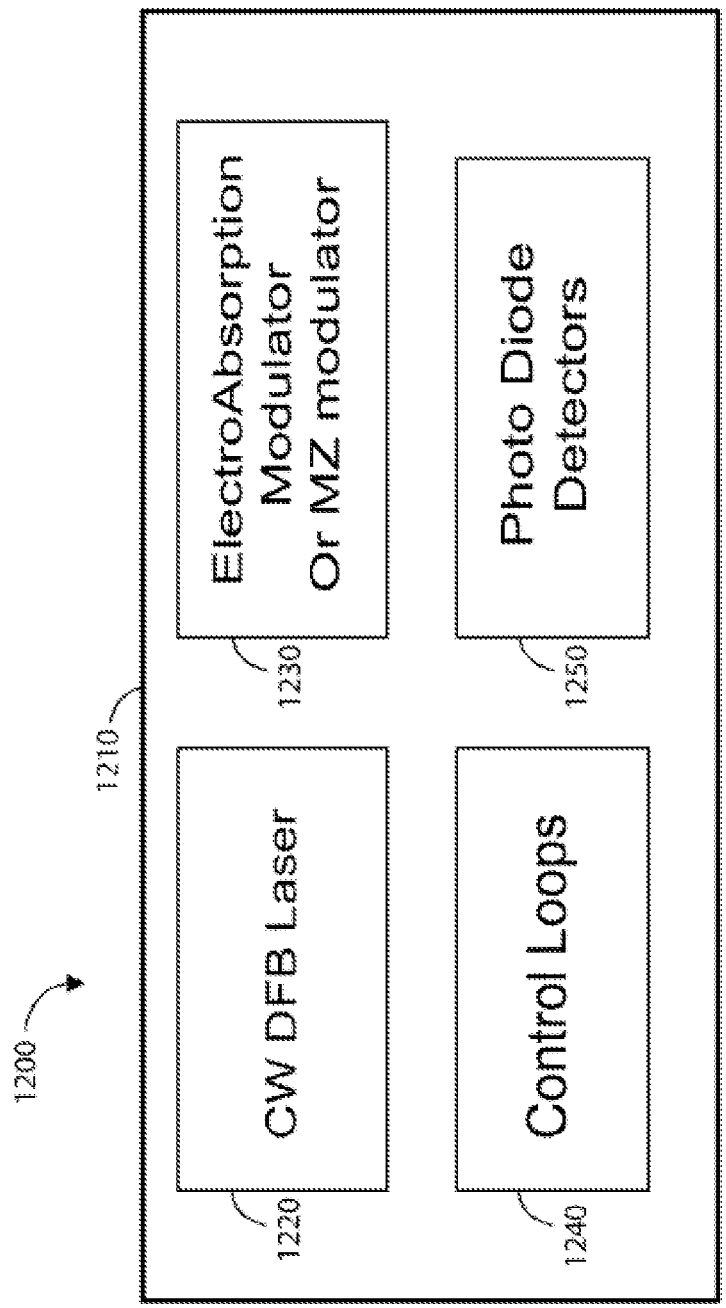
FIG. 12 is a simplified diagram of a silicon photonic block diagram according to an embodiment of the present invention.

FIG. 12 is a simplified diagram of a silicon photonic block diagram according to an embodiment of the present invention. As shown, the silicon photonics block 1200 can include a substrate 1210, a continuous wave (CW) distributed feedback (DFB) laser block 1220, an electro-absorption modulator or MZ modulator 1230, control loops 1240, and photo diode detectors 1250. Other variations, modifications, and alternatives will be recognized by those skilled in the art.

Figure 13:
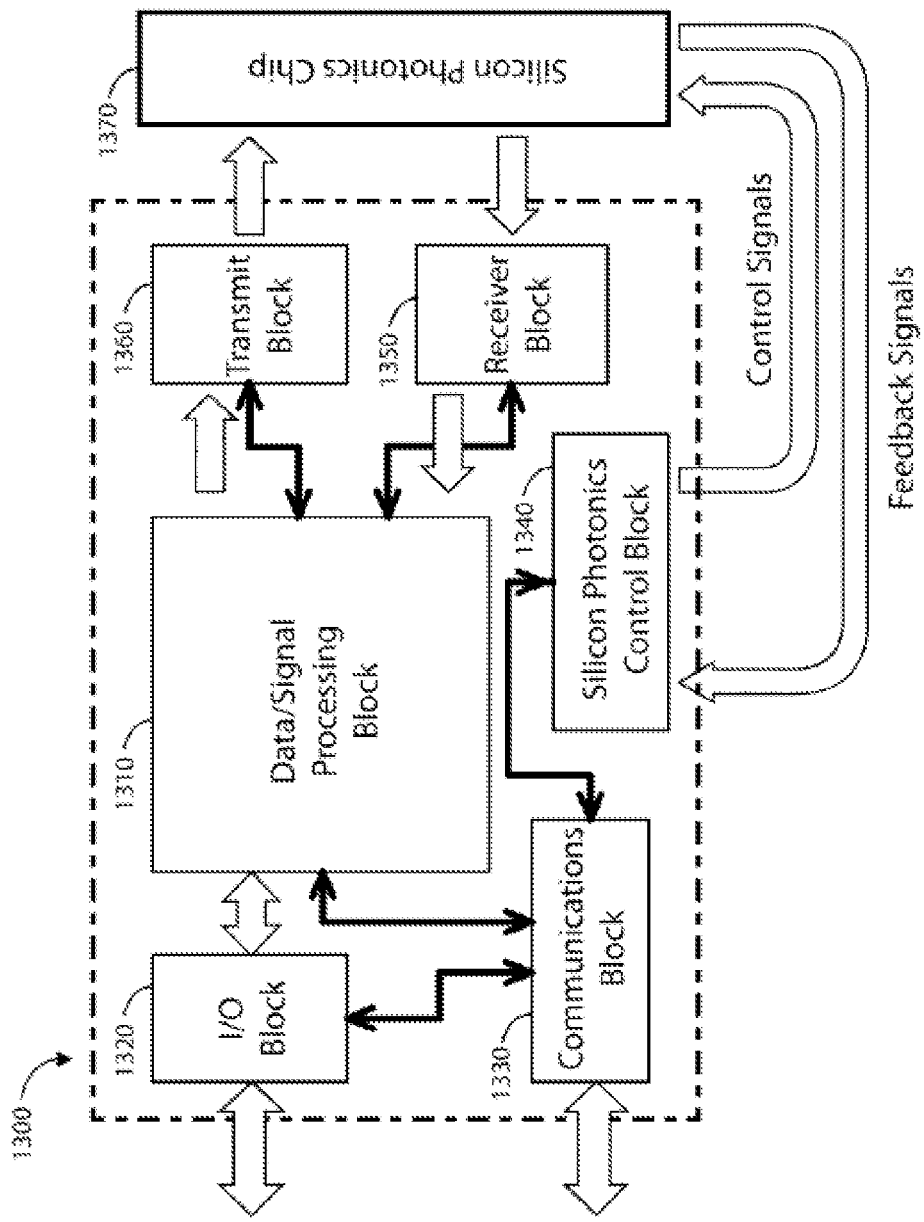
FIG. 13 is a simplified block diagram of a multi-chip module according to an alternative embodiment of the present invention.

FIG. 13 is a simplified block diagram of a multi-chip module according to an alternative embodiment of the present invention. As shown, the present invention includes an integrated system on chip device. The device 1300 is configured on a single silicon substrate member. The device has a data input/output interface provided on the substrate member and configured for a predefined data rate and protocol. The device has an input/output block 1320 provided on the substrate member and coupled to the data input/output interface. In an example, the input/output block 1320 comprises a SerDes block, a CDR block, a compensation block, and an equalizer block, among others. The device has a signal processing block 1310 provided on the substrate member and coupled to the input/output block 1320. In an example, the signal processing block 1310 is configured to the input/output block 1320 using a bi-direction bus in an intermediary protocol. The device has a driver module 1360 provided on the substrate member and coupled to the signal processing block. In an example, the driver module 1360 is coupled to the signal processing block 1310 using a unidirectional multi-lane bus. In an example, the device has a driver interface provided on the substrate member and coupled to the driver module 1360 and configured to be coupled to a silicon photonics device 1370. In an example, the driver interface is configured to transmit output data in either an amplitude modulation format or a combination of phase/amplitude modulation format or a phase modulation format. In an example, the device has a receiver module 1350 comprising a TIA block provided on the substrate member and to be coupled to the silicon photonics device 1370 using predefined modulation format, and configured to the digital signal processing block 1310 to communicate information to the input output block 1320 for transmission through the data input/output interface. In an example, the device has a communication block 1330 provided on the substrate member and operably coupled to the input/output block 1320, the digital signal processing block 1310, the driver block 1360, and the receiver block 1350, among others. The device has a communication interface coupled to the communication block 1330. The device has a control 20 block 1340 provided on the substrate member and coupled to the communication block 1330.

In an example, the signal processing block 1310 comprises a FEC block, a digital signal processing block, a framing block, a protocol block, and a redundancy block, among others. The driver module 1360 is selected from a current drive or a voltage driver in an example. In an example, the driver module is a differential driver or the like. In an example, the silicon photonics device 1370 is selected from an electro absorption modulator or electro optic modulator, or a Mach-Zehnder. In an example, the amplified modulation format is selected from NRZ format or PAM format. In an example, the phase modulation format is selected from BPSK or nPSK. In an example, the phase/amplitude modulation is QAM. In an example, the silicon photonic device 1370 is configured to convert the output data into an output transport data in a WDM signal. In an example, the control block 1340 is configured to initiate a laser bias or a modulator bias. In an example, the control block 1340 is configured for laser bias and power control of the silicon photonics device. In an example, the control block 1340 is configured with a thermal tuning or carrier tuning device each of which is configured on the silicon photonics device. In an example, the SerDes block is configured to convert a first data stream of N into a second data stream of M.

Figure 14:
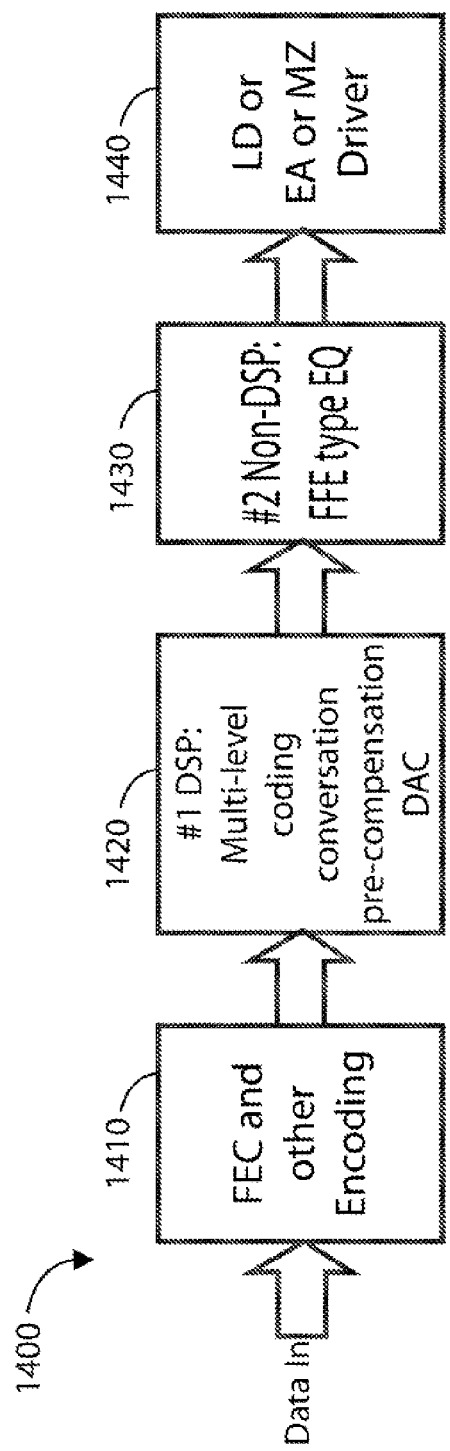
FIG. 14 is a simplified block diagram of data flow according to an embodiment of the present invention.

FIG. 14 is a simplified block diagram of data flow according to an embodiment of the present invention. As show is a stream of incoming data, which processed through multiple blocks. The blocks include, among others, forward error correction 1410, and other encoding, multi-level coding 1420, pre-compression, and digital to analog coding. The blocks also include non-DSP forward error correction 1430, and a block corresponding to a laser diode or driver 1440, among others. In an example, in the absence of a FEC from a host process, techniques include use an FEC internal to the CMOS chip. In an example, FEC can be striped across each or all of data lanes. Of course, there can be variations, modifications, and alternatives.

Figure 15:
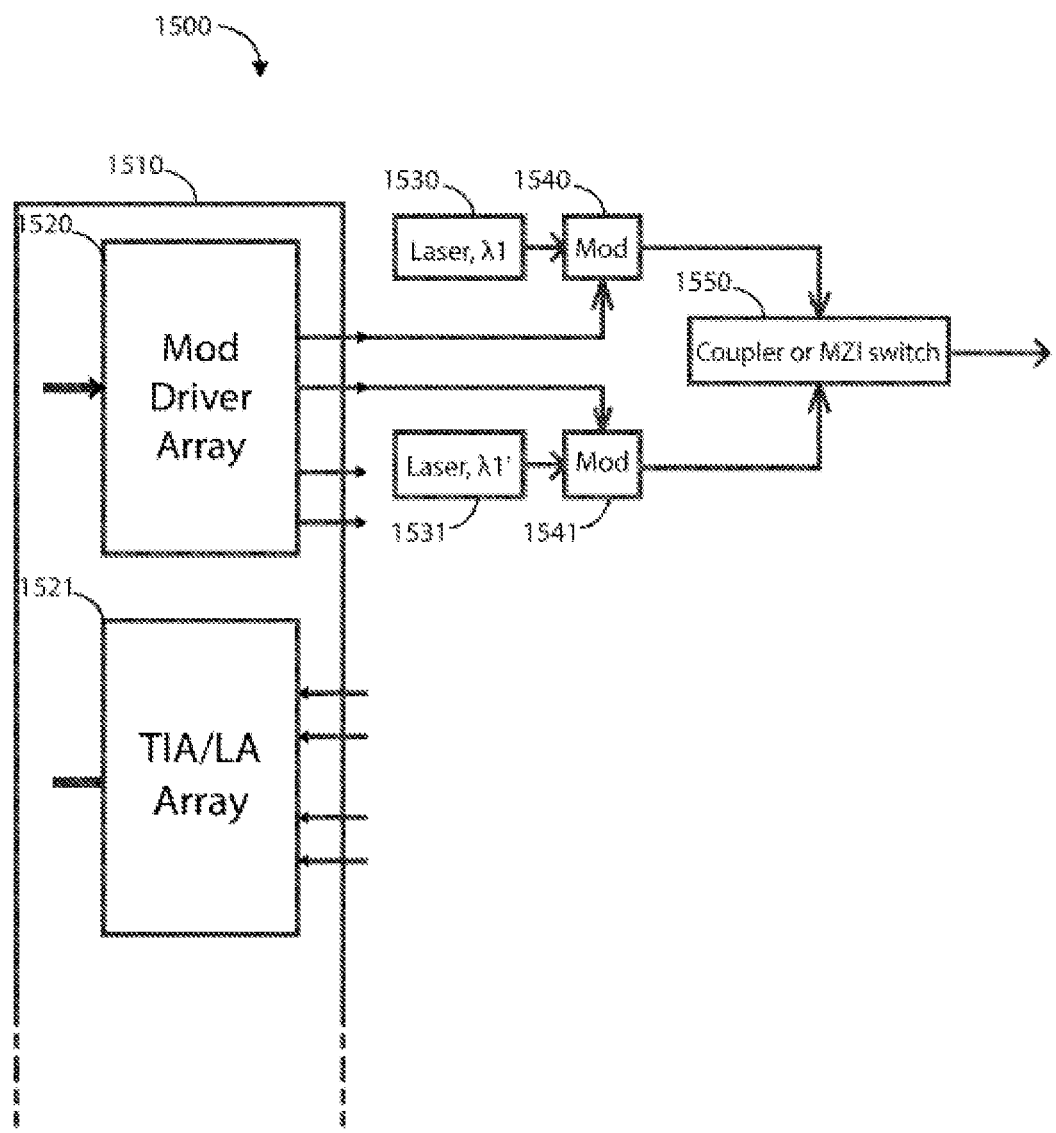
FIG. 15 is a simplified diagram illustrating a redundant laser configuration at a drive stage according to an embodiment of the present invention.

FIG. 15 is a simplified diagram illustrating a redundant laser configuration 1500 at a drive stage according to an embodiment of the present invention. In an example, the invention provides an integrated system on chip device 1510 having a redundant laser or lasers configured for each channel. The device 1510 can have a mod driver array 1520 and a TIA/LA array 1521. In an example, the device 1500 has a plurality of laser devices configured on the silicon photonics device. At least a pair of laser devices 1530, 1531 is associated with a channel and coupled to a switch 1550 to select one of the pair of laser devices to be coupled to an optical multiplexer to provide for a redundant laser device.

Figure 16:
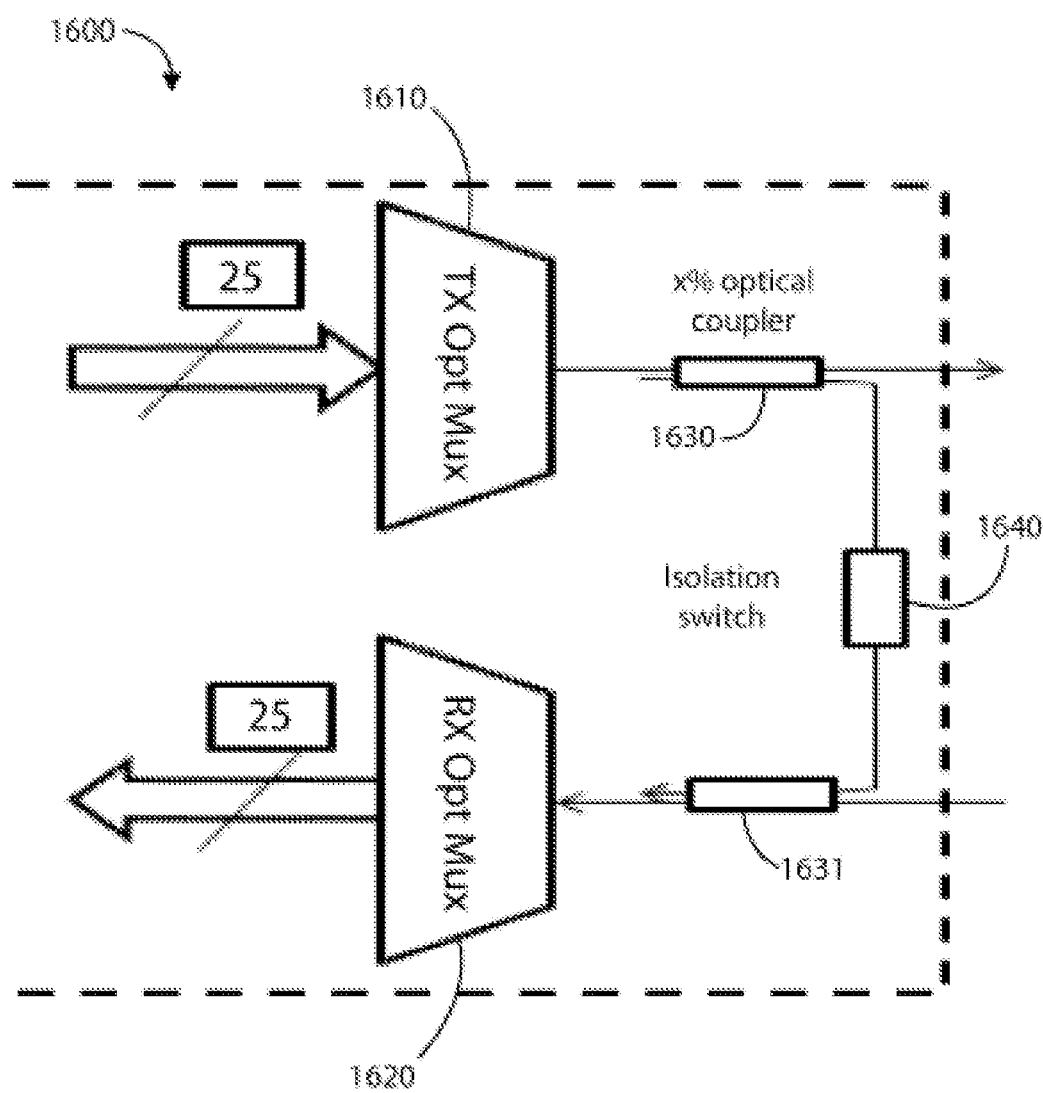
FIG. 16 is a simplified diagram illustrating a built-in self test using an optical loop back according to an embodiment of the present invention.

FIG. 16 is a simplified diagram illustrating a built-in self-test using an optical loop back according to an embodiment of the present invention. As shown are a TX multiplexer 1610 and an RX multiplexer 1620 for a silicon photonics device. In an example, the present invention provides an integrated system on chip device having a self test using a loop back technique. In an example, the device has a self-test block provided on the substrate. In an example, the self test block is configured to receive a loop back signal from at least one of the digital signal processing block, the driver module, or the silicon photonics device. In an example, the self test block comprises a variable output power switch configured to provide a stress receiver test from the loop back signal. Also shown is an isolation switch 1640 between RX and TX. Optical couplers 1630 and 1631 are coupled to the TX Mux and RX Mux, respectively, as well as the isolation switch 1640.

In an example, the present technique allows a loop back test capability on the device, which is now a silicon photonic application specific integrated circuit or a communication system on chip device, as described. In an example, the technique is provided for diagnostic and setup during power up sequence. In an example, an optical tap coupler on the output side connected to the input side as shown. In an example as shown, x (e.g., <10%) is selected to reduce and/or minimize an impact an output power as well an impact at the input power given that input power is generally much lower than the output power. In an example, to prevent crosstalk in the present loop back path, an isolation switch has been configured as shown. In an example, without the isolation switch there is undesirably direct crosstalk between the output and input as shown. In an example, about 30 dB isolation is included to prevent deleterious effects of coherent crosstalk. Of course, there can be variations.

Figure 17:
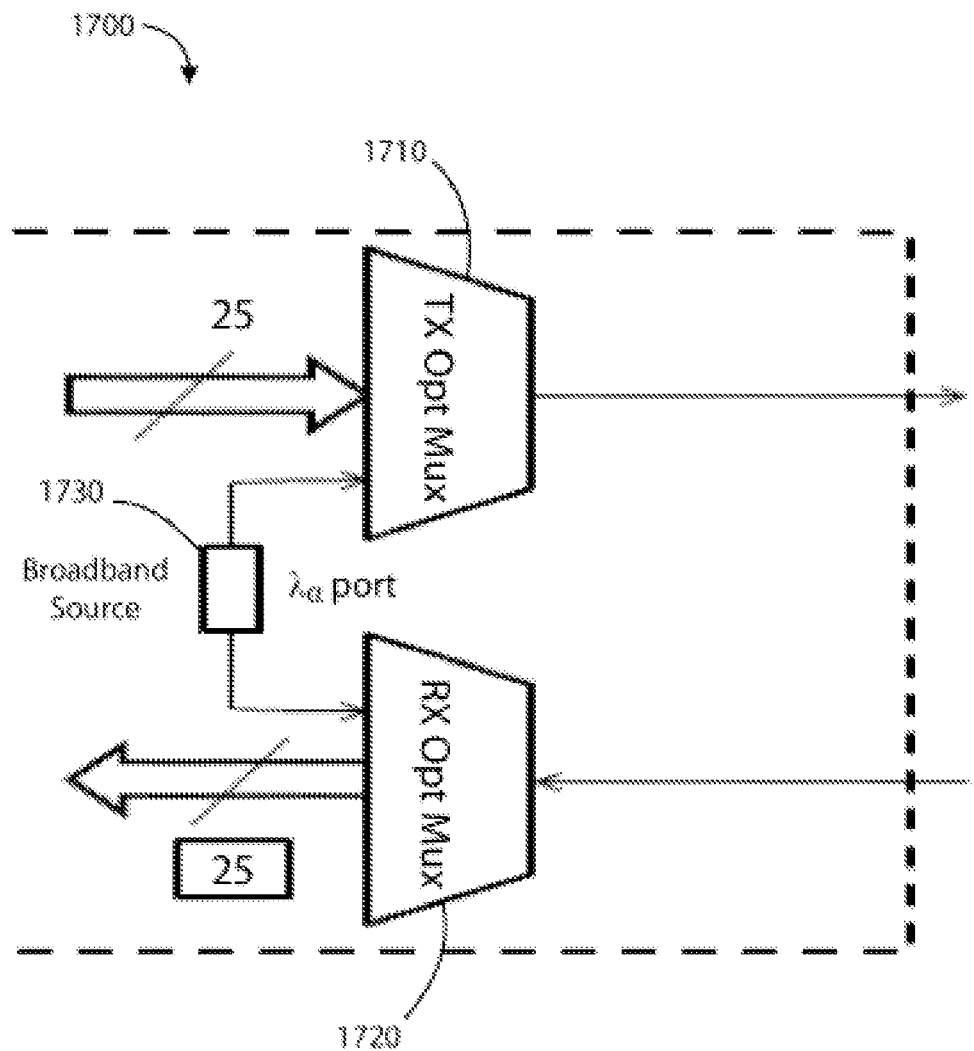
FIG. 17 is a simplified diagram illustrating a built-in self test configured for optical testing according to an embodiment of the present invention.

FIG. 17 is a simplified diagram illustrating a built-in self test configured for optical testing according to an embodiment of the present invention. In an example, the present invention provides an integrated system on chip device having a built-in self test technique. As shown are a TX multiplexer 1710 and an RX multiplexer 1720 for a silicon photonics device 1700. A broad band source 1730 is coupled to each of the multiplexers. Multiple sources can also be included. In an example, the device has a self test block configured on the silicon photonics device and to be operable during a test operation. In an example, the self test block comprises a broad band source configured to emit electromagnetic radiation from 1200 nm to 1400 nm or 1500 to 1600 nm to a multiplexer device. In an example, the broad band source 1730 can be an LED or other suitable device. The device also includes a self test output configured to a spectrum analyzer device external to the silicon photonics device. In an example, the technique can be provided during a calibration process. That is, if after calibration, a center') . . . of each multiplexer changed, the present technique including built-in light source will quantify or indicate the change in an example. In an example, the broadband source in silicon photonics is a light source with no optical feedback, although there can be variations.

Figure 18:
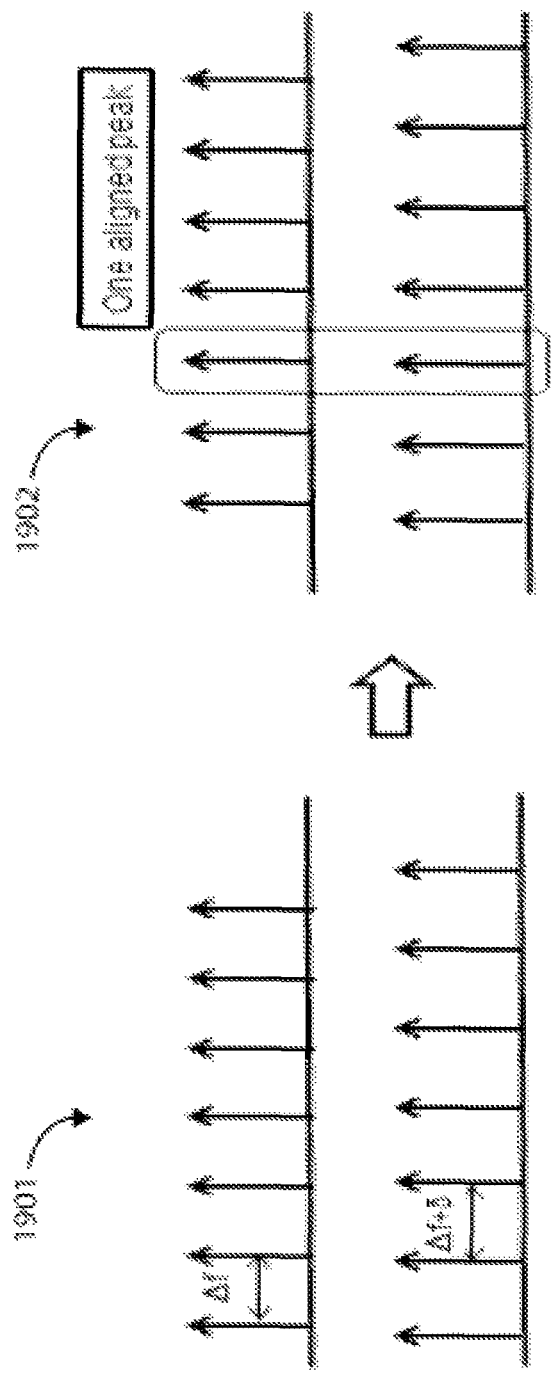
FIG. 18 is a simplified diagram illustrating wavelength tuning configured to silicon photonic device according to an embodiment of the present invention.

FIG. 18 is a simplified diagram illustrating wavelength tuning configured to silicon photonic device according to an embodiment of the present invention. In an example, the present tunable laser uses a set of rings or gratings with resonant frequencies that a slightly different. In an example, the technique use a vernier effect to tune the laser over a wide frequency range—limited by the bandwidth of the gain region. In an example, the Vernier desirably would be held in lock with respect to one another. In an example, the technique uses a dither frequency on one of the biases (e.g., heater) and lock the ring to the maximum transmission of the second ring or grating, although there can be variations. As shown in graph 1901, resonant combs are generally misaligned in an example. When tuned, thermally or otherwise, techniques can be used to selectively align one of the combs to another comb or spatial reference as shown in graph 1902.

In an example, to maintain alignment, the technique dithers the signal to one of the rings. Of course, there can be variations, alternatives, and modifications.

Figure 19:
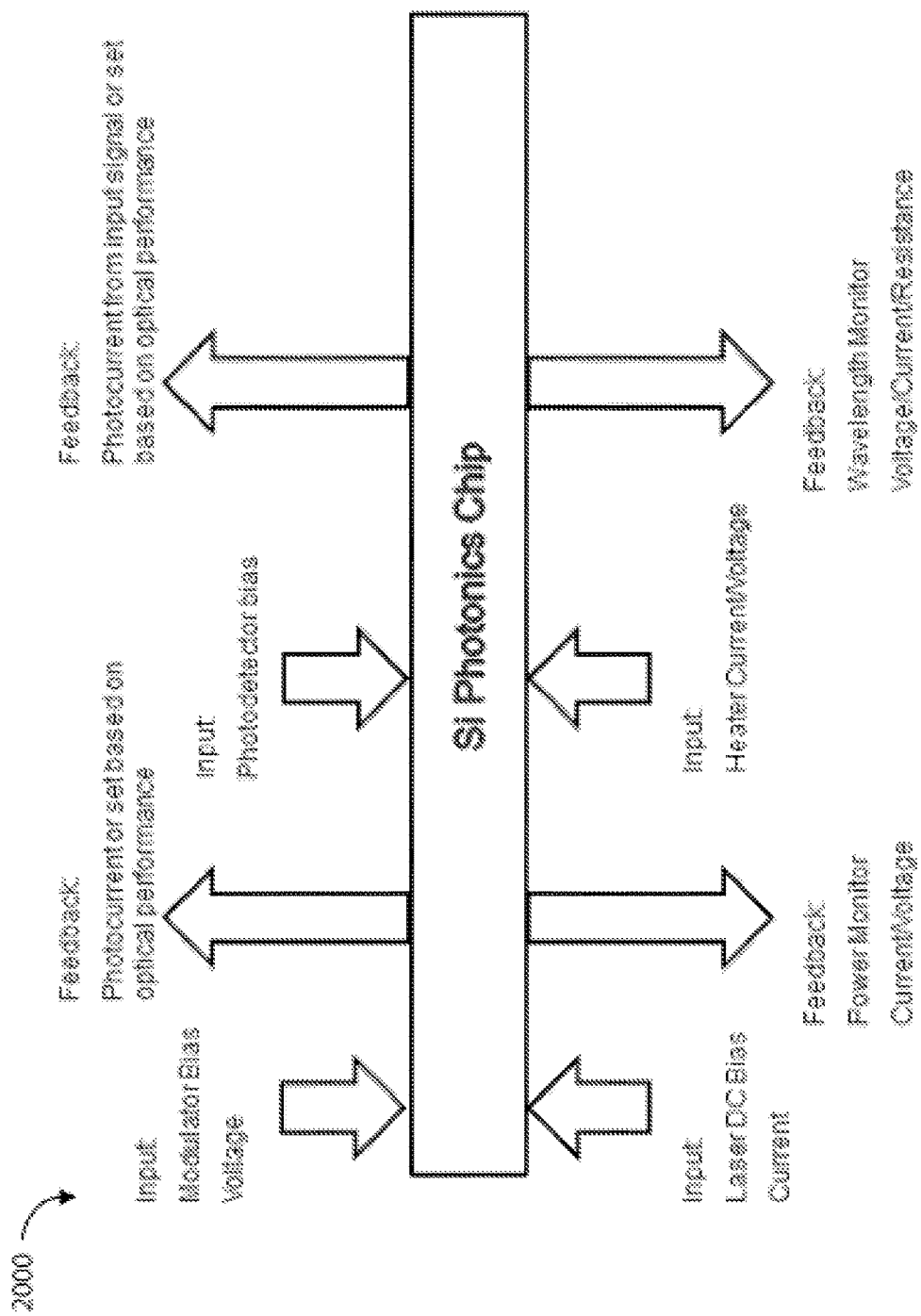
FIG. 19 is a simplified block diagram of an interface for a silicon photonics device according to an embodiment of the present invention.

FIG. 19 is a simplified block diagram of an interface for a silicon photonics device according to an embodiment of the present invention. In an example, the interface is provided to communicate between the control block and the silicon photonics device. The interface includes one or more of a modulator bias voltage input, a laser DC bias current input, a photocurrent or set output, a power monitor current/voltage output, a photodetector bias input, a heater current/voltage input, a photocurrent from input signal or set output, a wavelength monitor voltage/current/resistance output, among other elements. Of course, there can be variations.

Figure 20:
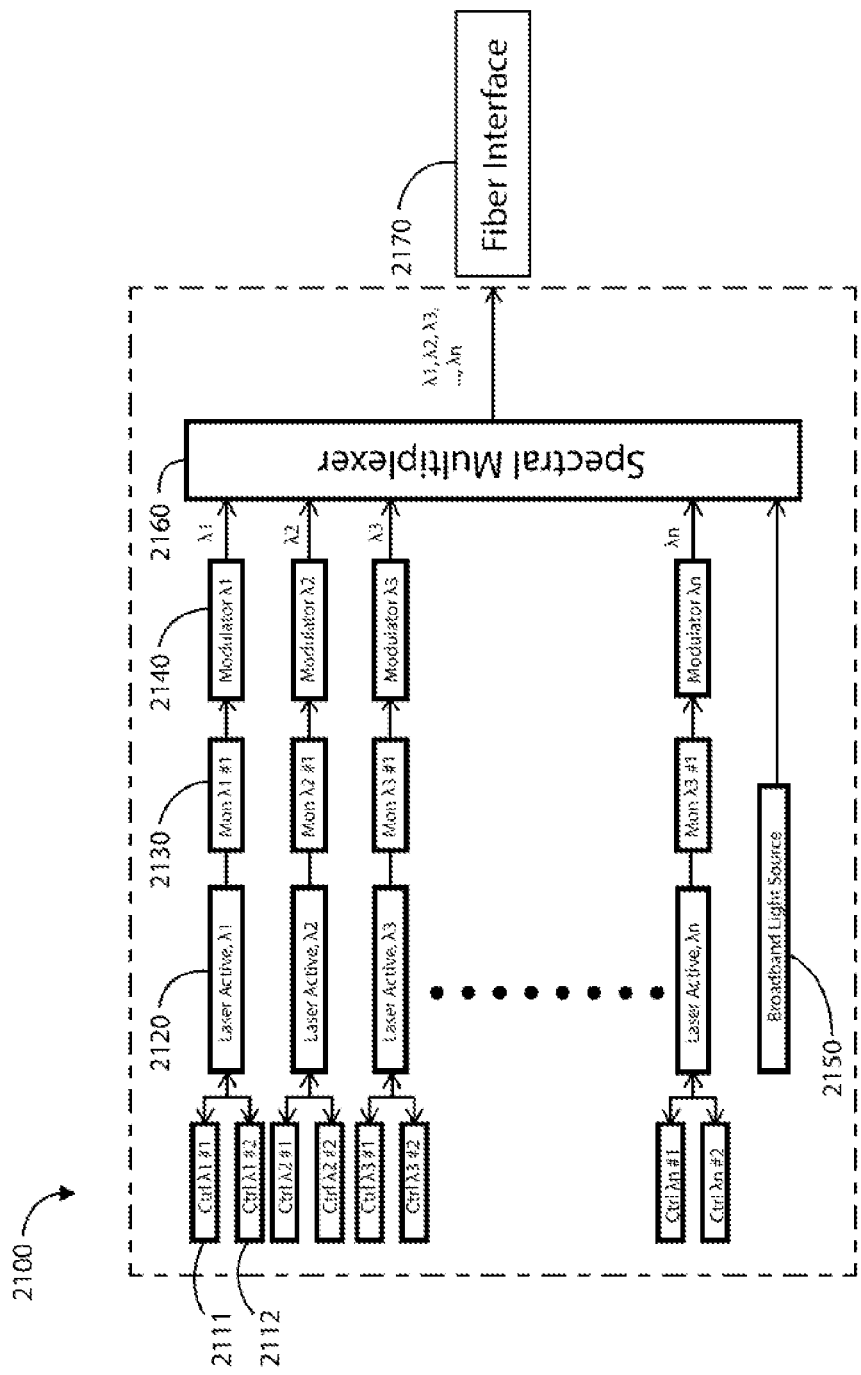
FIG. 20 is a simplified diagram illustrating a laser configuration at a transmitter side of a silicon photonics device according to an embodiment of the present invention.

FIG. 20 is a simplified diagram illustrating a laser configuration at a transmitter side of a silicon photonics device according to an embodiment of the present invention. As shown are a plurality of laser devices 2120 numbered from wavelength 1 ton, each of which has a modulator device 2140, and are collectively coupled to a spectral multiplexer 2160. Each of the laser devices 2120 are coupled to a pair of control blocks, such as blocks 2111 and 2112, and monitor blocks 2130. The spectral multiplexer 2160 is coupled to a fiber interface 2170. As shown is a broad band source 2150, as previously noted.

Figure 21:
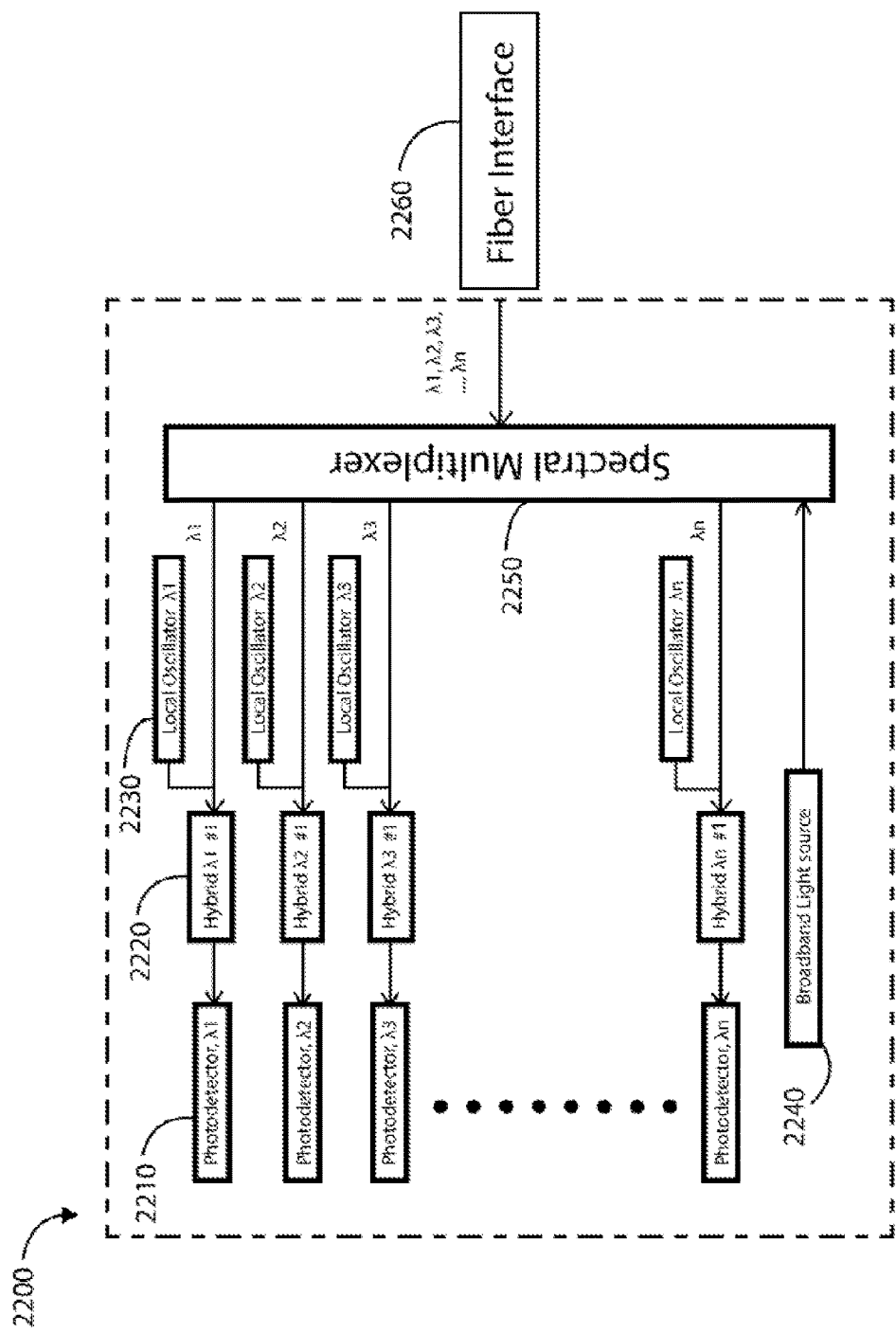
FIG. 21 is a simplified diagram illustrating a laser configuration at a receiver side of a silicon photonics device according to an embodiment of the present invention.

FIG. 21 is a simplified diagram illustrating a laser configuration at a receiver side of a silicon photonics device according to an embodiment of the present invention. As shown are a plurality of detectors 2210 numbered from wavelength 1 to n, each of which has an oscillator device 2230, and are collectively coupled to a spectral multiplexer 2250. Each of the photodetector blocks 2210 can be coupled to hybrid blocks 2220. The spectral multiplexer is coupled to a fiber interface 2260. As shown is a broad band source 2240, as previously noted.

Figure 23:
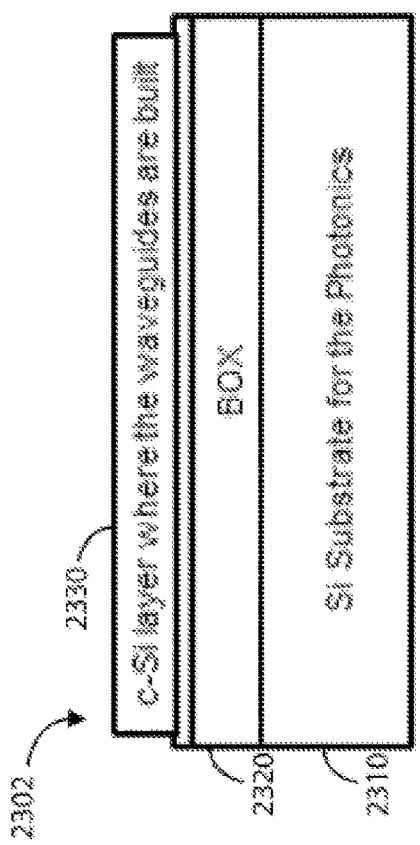
FIGS. 22 and 23 are simplified diagrams illustrating a hybrid light source for a silicon photonics device according to an embodiment of the present invention.
Figure 22:
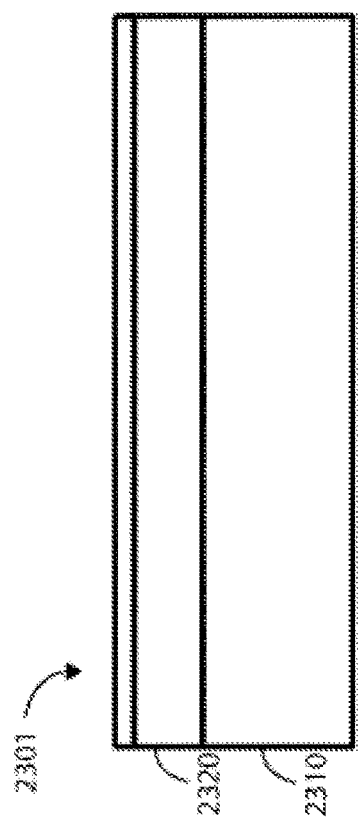

FIGS. 22 and 23 are simplified diagrams illustrating a hybrid light source for a silicon photonics device according to an embodiment of the present invention. As shown in FIG. 22, device 2301 includes a silicon substrate 2310 for photonics devices, and an overlying buried oxide region 2320. In FIG. 23, device 2302 includes the same substrate 2310 and buried oxide region 2320, and also includes an overlying crystalline silicon material 2330 configured for a waveguide or guides. Of course, there can be other variations, modifications, and alternatives.

FIG. 23 is a simplified diagram illustrating a wavelength control and locking configuration with a silicon photonic device according to an embodiment of the present invention. As shown, device 2401 shows a laser device coupled to control blocks, and a modulator block. Drivers #1 and #2 are coupled to the control blocks #1 and #2. A fixed bias setting is coupled to driver #2, whereas a variable bias setting is coupled to driver #1. The monitor block coupled to the modular and laser device is also coupled in series to a photocurrent detect circuit to TIA with bandwidth 2f-4fblock, where the dither frequency is f, a minimum detect circuit to derivative block, and the variable bias setting block.

As explained above, an important aspect of off-quadrature modulation is to stabilize an MZM at off-quadrature position(s). According to various embodiments, the transfer function of the MZM is utilized to obtain stable off-quadrature modulation. Near quadrature, the DC power ($A_0$) transferred through the MZM varies linearly with the phase angle. For example, near quadrature position, the amplitude ($A_1$) of a low-frequency tone applied to the MZM varies only slightly (nearly flat part of a sine function). Both $A_0$ and $A_1$ affect the bias positions. For example, by changing one or two of these parameters, quadrature positions can be modified. However, both of these parameters (i.e., $A_0$ and $A_1$) are subject to variability due to laser power fluctuations and/or coupling losses. Therefore it is not optimal to use either parameter by itself. of these two parameters are adjusted. More specifically, since the two parameters have a mathematical relationship based on the phase angle, the ratio of the two parameters $$\left(M1 = \frac{A1}{A0}\right)$$

is used as a metric, as this parameter $M_1$ is not affected by losses or laser power stability.

Maintaining ratio $M_1$ requires determining both $A_0$ and $A_1$. Since parameter, $A_0$, as explained above, is in a substantially linear relationship with the phase, a dither tone is used to measure $A_1$ in a calibration process.

According to various embodiments, an amplitude measurement $A_2$ and a ratio $M_2$ are used in lieu of $A_1$ and $M_1$ respectively. The parameter $A_2$ refers to the amplitude second harmonic tone of the measured amplitude (where $A_1$ is the amplitude of the measured fundamental). For example, the ratio $M_2$ can be expressed as $$M2 = \frac{A2}{A0}$$

where the $A_2$ amplitude is compared against parameters $A_1$ and $A_0$.

Figure 24:
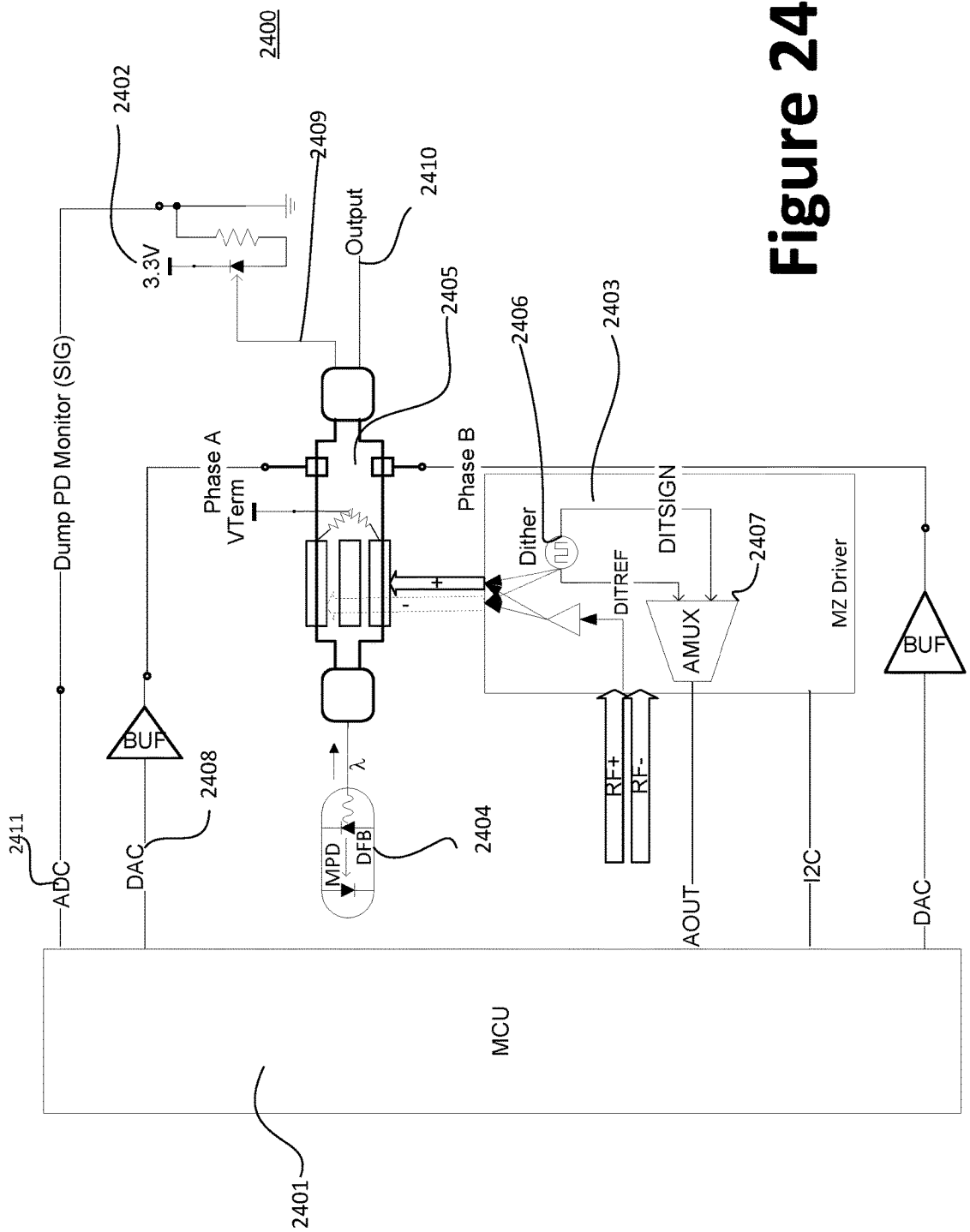
FIG. 24 is a simplified diagram illustrating an off-quadrature modulation system 2400 according to embodiments of the present invention.

FIG. 24 is a simplified diagram illustrating an off-quadrature modulation system 2400 according to embodiments of the present invention. This diagram is merely an example, which should not unduly limit the scope of the claims. One of ordinary skill in the art would recognize many variations, alternatives, and modifications. As shown in FIG. 24, system 2400 includes a laser source 2404. In various embodiments, laser source 2504 includes a laser diode and with distributed feedback (DFB) mechanism as shown. Depending on the specific implementation, laser source 2404 may operate in various frequencies or wavelengths. Lighting coming out of the laser source 2404 is modulated by the Mach-Zehnder modulator (MZM) 2405. MZM 2405 is coupled to driver 2403. For example, driver 2403 comprises a Mach-Zehnder driver that provides driving signals to the MZM 2405.

According to an embodiment, drive 2403 comprises an internal clock operating at a frequency $F_C$. For example, frequency $F_C$ is between 10 MHz to 100 MHz, but and other frequencies are possible as well. According to various embodiments, frequency $F_C$ is associated with the frequency of the dither tone that is generated by the driver 2403. Driver 2403 additionally includes an RF current amplifier for processing the RF signal input. For example, a dither tone is added to the RF signal for the purpose determining parameters of off-quadrature modulation. In according to a specific embodiment, the dither tone in addition to RF signal (where n is set by programmable frequency control) at frequency $f_d$ defined by Equation 1 below:

$$f_d = F_C\left(\frac{1}{12}\right)\left(\frac{1}{188}\right)\left(\frac{1}{n+1}\right) \qquad \text{Equation 1}$$

As shown in FIG. 24, dither tone is generated by the source 2406 and coupled to the RF signal pairs (i.e., RF+ and RF− as shown) to drive the MZM 2505. Additionally, source 2406 provides output signals DITREF and DITSIGN. DITREF signal is a dither tone replica (DITREF in FIG. 24), which is an amplified version of dither tone to be read by microcontroller unit (MCU) 2401 as a reference. The dither tone and the dither tone replica are substantially constant and thus can be used as a reference during the calibration process for determining off-quadrature parameters. More specifically, the dither tone is compared against the AC power component. In addition to the dither tone replica DITREF signal, the DITSIGN signal comprises a square wave version of dither signal, which is TTL version of the sign of the dither tone.

Driver 2403 additionally includes an analog multiplexer 2407, which is configured for multiplexing DITSIGN and DITREF signals, as well as multiplexing multiple channels. Among other things, driver 2403 also provides an interrupt signal to the MCU 2401 as needed for calibration.

Mach-Zahnder modulator (MZM) 2405 modulates laser light from the laser source 2404 with the driver signals from driver 2403. For example, MZM 2405 comprises an RF modulator to perform modulation on the light as using the RF driver signals from the driver 2403. Additionally, MZM 2405 may provide phase trim adjustments for proper alignment. MCU 2401 is configured to generate control signal for performing phase trim, which is converted to an analog signal by the DAC 2408. The MZM 2405 uses the analog control signal to perform phase trimming as needed for off-quadrature modulation. MZM 2405 comprises an output 2410 and an output 2409. As shown in FIG. 24, output 2409 of the MZM 2405 is coupled to the dump PD monitor, which is used for measuring and sampling the MZM output.

Microcontroller unit (MCU) 2401 provides control functions, which include calibration the off-quadrature parameters. According to various embodiments, MCU 2401 includes RAM buffers, an analog-to-digital converter (ADC) with signal multiplexer. MCU 2401 additionally includes a digital-to-analog converter (DAC) that is configured to adjust phase trim on MZM 2405. MCU 2401 is specifically configured to operate in a calibration mode to determine off-quadrature parameters. MCU 2401 receives output of the multiplexer 2407 to uses the dither tone generated at driver 2403 as a reference. The MCU 2401 additionally performs analog to digital conversion on the modulated dither tone provided by the MZM 2405. It is to be appreciated that by using dither tones, as described below, the MCU 2401 determines the off-quadrature parameters.

As mentioned above, power transfer of MZM can be characterized as sinusoid function of phase angle. For example, quadrature is defined as the 90° point where the transfer function is most linear. As explained above, conventional biasing techniques usually is usually at quadrature positions. According to embodiments of the present invention, modulation is performed at off-quadrature positions. For example, by using a feedback system, the off-quadrature positions are determined. For example, the MZM may be biased below quadrature, for example, at 75° to 80°. The output power can be expressed using Equation 2 below:

$$P_o = P_i(1 + \sin(\phi))$$ Equation 2:

The phase angle $\phi$ is determined by the optical path length difference between the two arms of the MZM. In various embodiments, the MZM is configured to perform phase trimming. More specifically, phase trimming is directly controlled via the phase trim adjustments from DACs controlled by the MCU. It is to be appreciated that the MCU is configured to keep and stabilize the phase angle $\phi$ at the specified angle. The MZM (e.g., MZM 2405 in FIG. 24) has two output paths, the primary path and the dump path. For example, as shown in FIG. 24, MZM 2405 includes a primary path 2410 for providing output signal. The dump path 2409 of MZM 2405 is connected to a photodiode whose photocurrent can be measured via the ADC 2411 of the MCU 2401. The ADC 2411 is used to measure both DC power ($A_0$) and amplitude of the low-frequency tone ($A_1$). As explained above, since ratio $M_1$ between $A_1/A_0$ is to be used as the off-quadrature parameter, units associated with $A_0$ and $A_1$ are ignored during the calibration process. For example, DC power $A_0$ is an average measurement on the ADC 2411. A1 is the amplitude of the dither tone (generated by driver 2403 in FIG. 24) applied to the RF data as seen by the dump PD. It is to be appreciated that an important aspect of determining parameter $M_1$ is to measure $A_1$ correctly and efficiently.

During the calibration process, the MCU is asynchronous with the dither tone generated by the driver, and the square-wave version of dither tone (e.g., DITSIGN) is used to provide synchronization between the dither-tone replica reference signal generated by the driver and the actual signal measured on the dump PD. By phase-synchronizing the reference dither tone signal and the measure dither tone signal, a synchronous detection process can be used to measure A1.

Figure 25A:
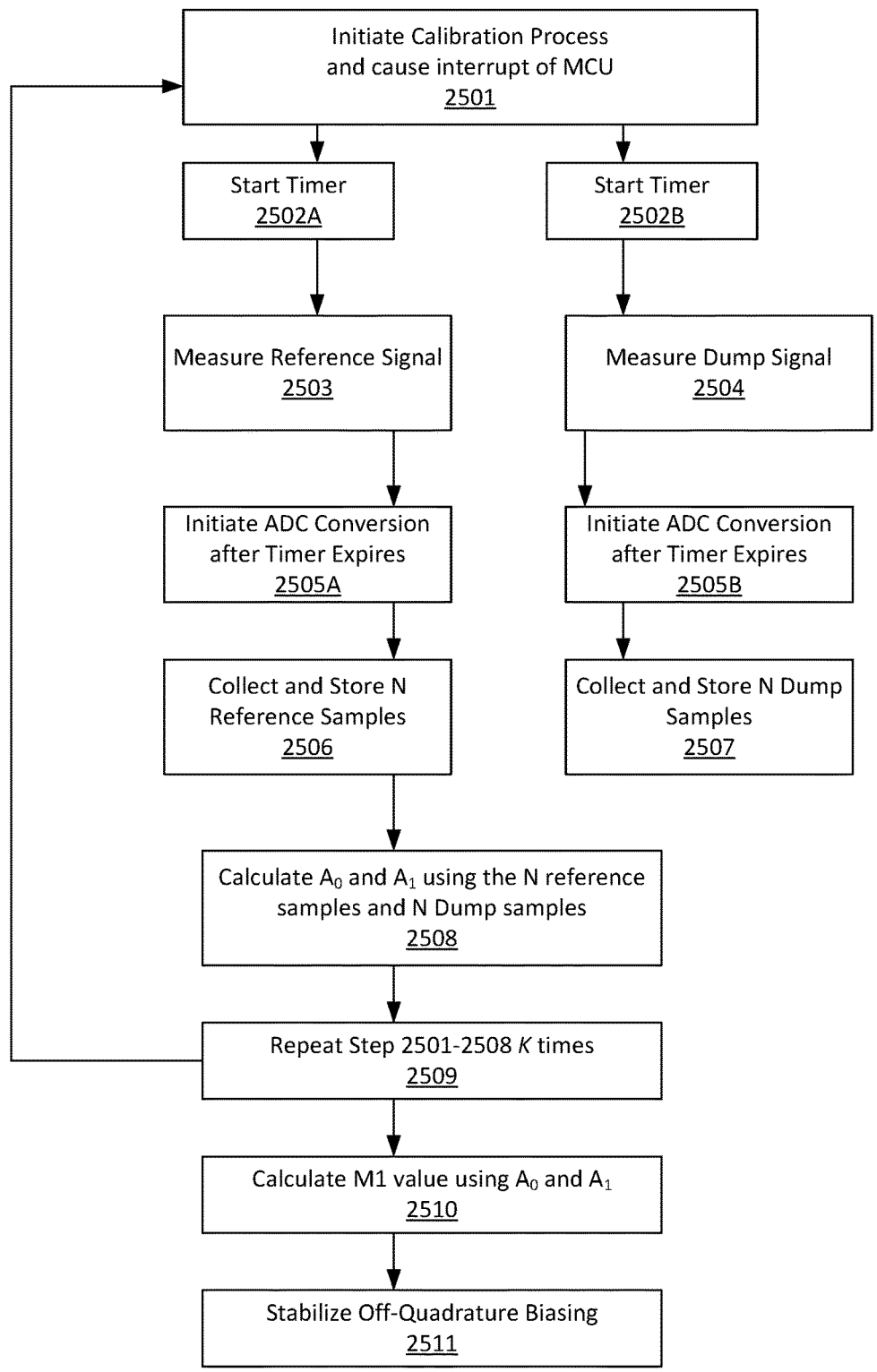
FIG. 25A is a simplified flow diagram illustrating a process for determining off-quadrature biasing parameters according to embodiments of the present invention.

FIG. 25A is a simplified flow diagram illustrating a process for determining off-quadrature biasing parameters according to embodiments of the present invention. This diagram is merely an example, which should not unduly limit the scope of the claims. One of ordinary skill in the art would recognize many variations, alternatives, and modifications. For example, one or more in FIG. 25A may be added, removed, repeated, replaced, modified, re-arranged, and/or overlapped, which should not unduly limit the scope of the claims. As an example, the process illustrated in FIG. 25A can be performed by system 2400 illustrated in FIG. 24. As shown in FIG. 25A, a calibration process for providing off-quadrature biasing is initiated at step 2501. More specifically, the calibration process is used to determine parameter $M_1$ needed for an off-quadrature phase (e.g., 70 degrees). As a part of the initiation process, the driver provides a signal that interrupts the MCU. In a specific embodiment, the rising edge of the DITSIGN signal, which is a square wave version of the dither tone signal, from the driver is used as the interrupt signal. As a part of initiation process, the driver also disables the DITSIGN signal. The interrupt signal also starts the timer, as shown in steps 2502A and 2502B.

Figure 25B:
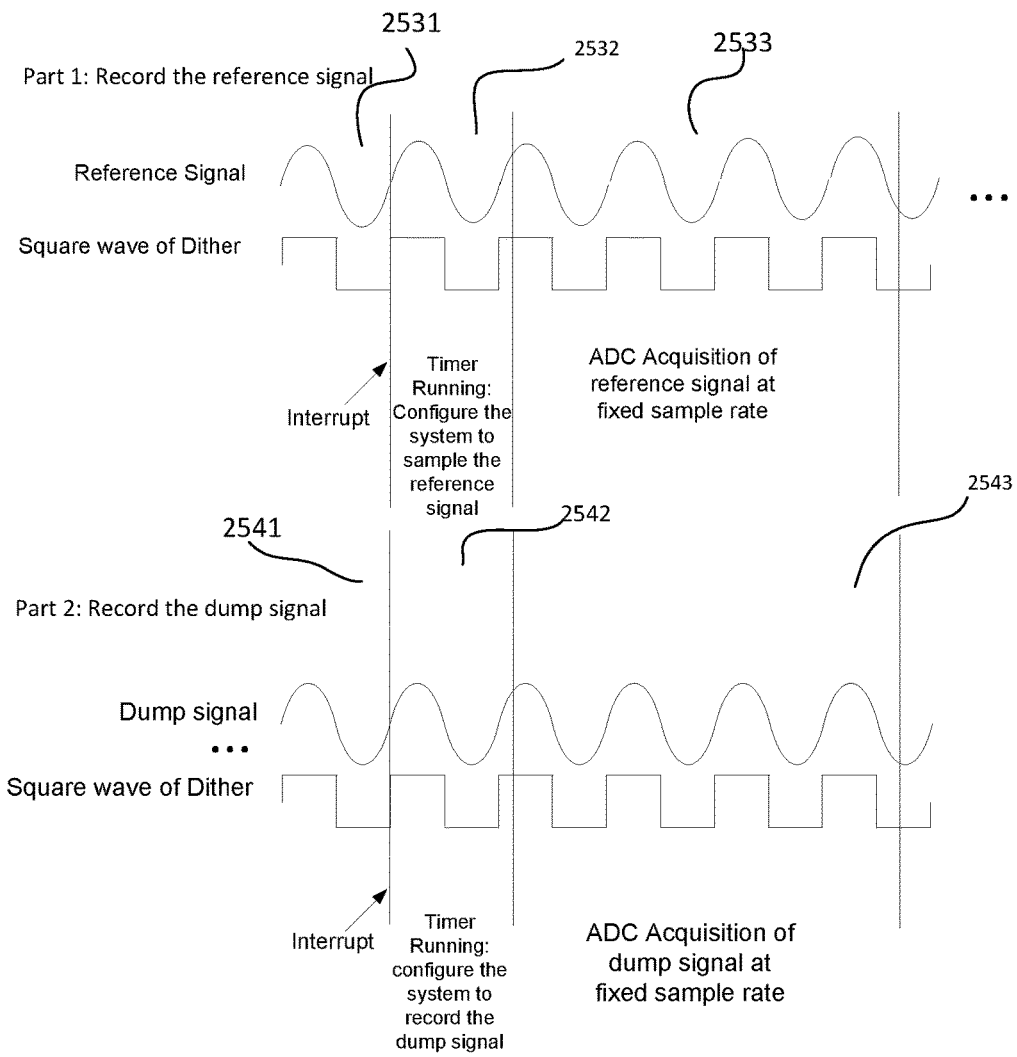
FIG. 25B is a simplified timing diagram illustrating a process for determining off-quadrature biasing parameters according to embodiments of the present invention.

FIG. 25B is a simplified timing diagram illustrating a process for determining off-quadrature biasing parameters according to embodiments of the present invention. This diagram is merely an example, which should not unduly limit the scope of the claims. One of ordinary skill in the art would recognize many variations, alternatives, and modifications. Part 1 of the timing diagram illustrates the process of recording the reference signal, and the Part 2 of the timing diagram illustrates the process of recording the dump signal. At time intervals 2531 and 2541 respectively corresponding to the interrupt signal provided at step 2501 of FIG. 25A, the interrupt signal is used to start the calibration process. In a specific embodiment, the interrupt signal is specifically chose at the rising edge of the square wave. It is to be understood that the interrupt signal can be provide at other phases as well.

Now referring back to FIG. 25A. At step 2502A, a timer is initiated for measuring reference dither tone signal. For example, the timer is an internal component of the MCU. In various embodiments, timer length is predetermined based on the time need to set various parameters for analog components (e.g., ADC, electrical components, etc.) to switch to measuring the reference dither tone signal. For example, the timer length is predetermined to allow the ADC to measure the DITREF signal from the deriver. For example, the reference dither tone signal DITREF is an amplified version of the dither tone signal. At step 2503, the reference signal DITREF is measured by the ADC. In various embodiments, the analog multiplexer (e.g., AMUX 2407 in FIG. 24) is adjusted to allow the ADC to measure DIFREF. At step 2505A, timer expires and ADC conversion process is initiated. For example, the expiration of the timer generates a signal to starts the ADC conversion process. The ADC conversion process is performed at a predetermined fixed sample rate ($F_s$). For example, $F_s$ is selected based the number N of reference signal samples. At step 2506, N reference samples are collected and stored into a first buffer. For example, the MCU comprises buffers (e.g., RAM, registers, etc.) that can be used to store the N reference samples.

As shown in FIG. 25A, a timer is started at step 2502B. Depending on the specific implementation, the timer used in step 2502B may be the same timer user for measuring reference dither tone signal in step 2502A. Similarly, timer length is predetermined to be the time need to set various parameters for analog components to switch to measuring dump signal based on the output of the MZM. For example, the timer length is predetermined to allow the ADC to measure the dump signal (SIG) from the MZM. At step 2504, the dump signal is measured by the ADC. For example, the analog multiplexer is adjusted to allow the ADC to measure the dump signal. At step 2505B, timer expires and ADC conversion process is initiated. For example, the expiration of the timer generates a signal to starts the ADC conversion process to sample the dump samples. The ADC conversion process is performed at the predetermined fixed sample rate ($F_s$), which is same as sample rate for converting the reference signal. The same sample rate $F_s$ is used so that the same number N of samples for dump sample is to be collected. At step 2507, N dump samples are collected and stored into a second buffer. For example, the second buffer is implemented as a part of the MCU.

For example, the timer period at step 2502A corresponds to time interval 2532 and the timer period at step 2502B corresponds to the time interval 2542 in FIG. 25B. It is to be understood that time interval 2532 matches the time interval 2542, as a comparison between the reference signal and the dump signal is only useful when the correct data are compared. In addition to matching period for sampling the reference signal and the dump signal, the ADC acquisition of reference signal at timer interval 2533 and time interval 2543 respectively are also at a predetermined fixed sample rate to ensure that the ADC sampled reference signal and dump signal match each other.

At step 2508, parameters $A_0$ and $A_1$ are calculated using the samples stored at the first buffer and the second buffer. More specifically, $A_0$ is calculated by summing the dump sample values store at the second buffer. $A_1$ is a function of a dot product between dump sample values stored at the second buffer and the reference sample values stored at the first buffer. In various embodiments, A1 is calculated using Equation 3 below:

$$A_1 = 2 * \Sigma_1^N (S_i * R_i) \qquad \text{Equation 3:}$$

Whereas as each of the $S_i$ is a sample stored at the second buffer, each of the $R_i$ is a reference sample values stored at the first buffer, and N is the number of samples.

Since parameter $M_1$ that is to be calculated is a ratio between $A_0$ and $A_1$, it is unnecessary to divide $A_0$ or $A_1$ by N. To get reliable result, steps 2509 repeats steps 2501 through 2508 K times so that average $A_0$ and $A_1$ can be used for calculating $M_1$.

At step 2510, parameter $M_1$ is calculated. More specifically, Equation 4 below is used to calculate parameter $M_1$:

$$M_1 = \frac{\sum A_{0_i}}{\sum A_{1_i}} \text{(wherein } i = 1 \ldots K\text{)} \qquad \text{Equation 4}$$

At step 2511, parameter $M_i$ is used as a control loop target for stabilizing off-quadrature biasing. For example, various types of control loop can be used to keep M1 stable, which translates to a stable off-quadrature biasing for the modulation. For example, phase trim signal from the MCU, DC power and the dither tone used for the MZM, and/or other variables may be used as an input value in the control loop to change parameter $M_1$ via the feedback control loop, where the input value is varied until parameter $M_1$ is stabilized and the corresponding off-quadrature positions are therefore achieved. Other input values (or "knob") can be used as well to adjust and stabilize parameter $M_1$ as well. Depending on the implementation, other types of control loop (e.g., PID, single-step, etc.) can be used as well.

It is to be appreciated that according to certain embodiments, parameter $M_1$ is recorded with an optimized system and, and parameter $M_1$ value is targeted by the control loop. An initial calibration and optimization process is performed can provide great system performance. In some embodiments, the mathematics of the transfer function can be used to precisely calculate the desired value of parameter $M_1$ with known constants. By using the transfer function, initial calibration and optimization process can be omitted, but may subject to system uncertainties.

Figure 26:
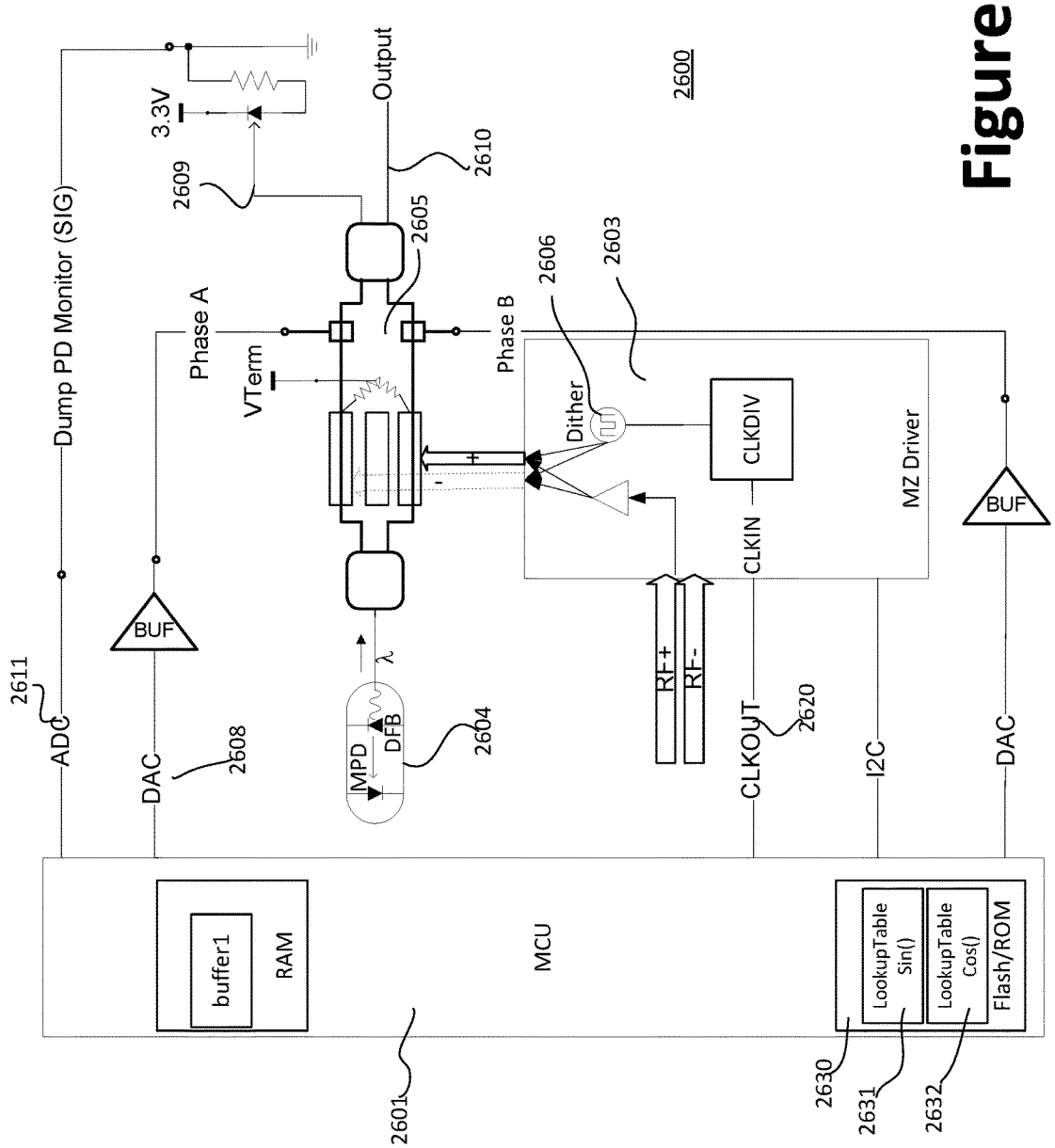
FIG. 26 is a simplified diagram illustrating an off-quadrature modulation system 2600 with a lookup table according to embodiments of the present invention.

FIG. 26 is a simplified diagram illustrating an off-quadrature modulation system 2600 with a lookup table according to embodiments of the present invention. This diagram is merely an example, which should not unduly limit the scope of the claims. One of ordinary skill in the art would recognize many variations, alternatives, and modifications. As shown in FIG. 26, system 2600 includes a laser source 2604. In various embodiments, laser source 2604 includes a laser diode and with distributed feedback (DFB) mechanism as shown. Lighting coming out of the laser source 2604 is modulated by the Mach-Zehnder modulator (MZM) 2605. MZM 2605 is coupled to driver 2603. The MZM 2605 receives phase trim signal from the MCU for modifying the modulation phase, which can be used to maintain off-quadrature modulation positions. Driver 2403 comprises a Mach-Zehnder driver that provides driving signals to the MZM 2405.

According to an embodiment, drive 2403 receives clock signal output 2620 from the MCU 2601, and the clock signal output 2620 is as by the dither tone source 2606. For example, dither tone is generated by manipulating the clock signal output 2620. According to various embodiments, a frequency $f_d$ is associated with the frequency of the dither tone. Driver 2403 additionally includes an RF current amplifier for processing the RF signal input. For example, a dither tone is added to the RF signal for the purpose determining parameters of off-quadrature modulation.

The Mach-Zahnder modulator (MZM) 2605 modulates laser light from laser source 2604 with the driver signals from driver 2603. For example, MZM 2605 comprises an RF modulation to perform modulation on the light as using the RF driver signals from the driver 2603. Additionally, MZM 2605 provides phase trim adjustments for proper alignment using control signal from the MCU. MCU 2601 is configured to generate control signal for performing phase trim, which is converted to an analog signal by the DAC 2608. The MZM uses the analog control signal to perform phase trimming as needed for off-quadrature modulation. MZM 2605 comprises output 2609 and output 2610. As shown in FIG. 26, output 2609 of the MZM 2605 is coupled to the dump PD monitor, which is used for measuring and sampling the MZM output.

Microcontroller unit (MCU) 2601 provides control functions, which include calibration the off-quadrature parameters. According to various embodiments, MCU 2601 includes RAM buffers, an analog-to-digital converter (ADC) with signal multiplexer. The MCU 2601 also comprises an internal clock that provides the clock signal 2620. MCU 2601 additionally includes a digital-to-analog converter (DAC) that is configured to adjust phase trim on MZM 2605. MCU 2601 is specifically configured to operate in a calibration mode to determine off-quadrature parameters. MCU 2601 includes a memory 2630 for storing predetermined sine and cosine functions based on dither tone values. Depending on the implementation, memory 2630 may be implemented using flash memory, read-only memory, and/or other types of memory storage. For example, memory 2630 provides storage for lookup table 2631 that stores sine function values and lookup table 2632 that stores cosine function values.

In various embodiments, the frequency $f_d$ of the dither tone is known with high precision. Since the frequency $f_d$ is known, then coherent detection (i.e., IQ demodulation) can be used to determine the dither tone amplitude ($A_1$) by calculating lookup tables V with N entries, using Equations 5 and 6 below, at sample rate $F_s$ (corresponding the sampling rate of the MZM output signal) spacing of sine and cosine functions of dither frequency ($f_d$):

$$S_j = \sin(2\pi f_d t) \qquad \text{Equation 5:}$$

$$C_j = \cos(2\pi f_d t) \qquad \text{Equation 6:}$$

During a process for determining parameter $M_1$, the dither tone amplitude A1 values are not measured (as by system 2400), but obtained from the lookup tables 2631 and 2632.

Figure 27:
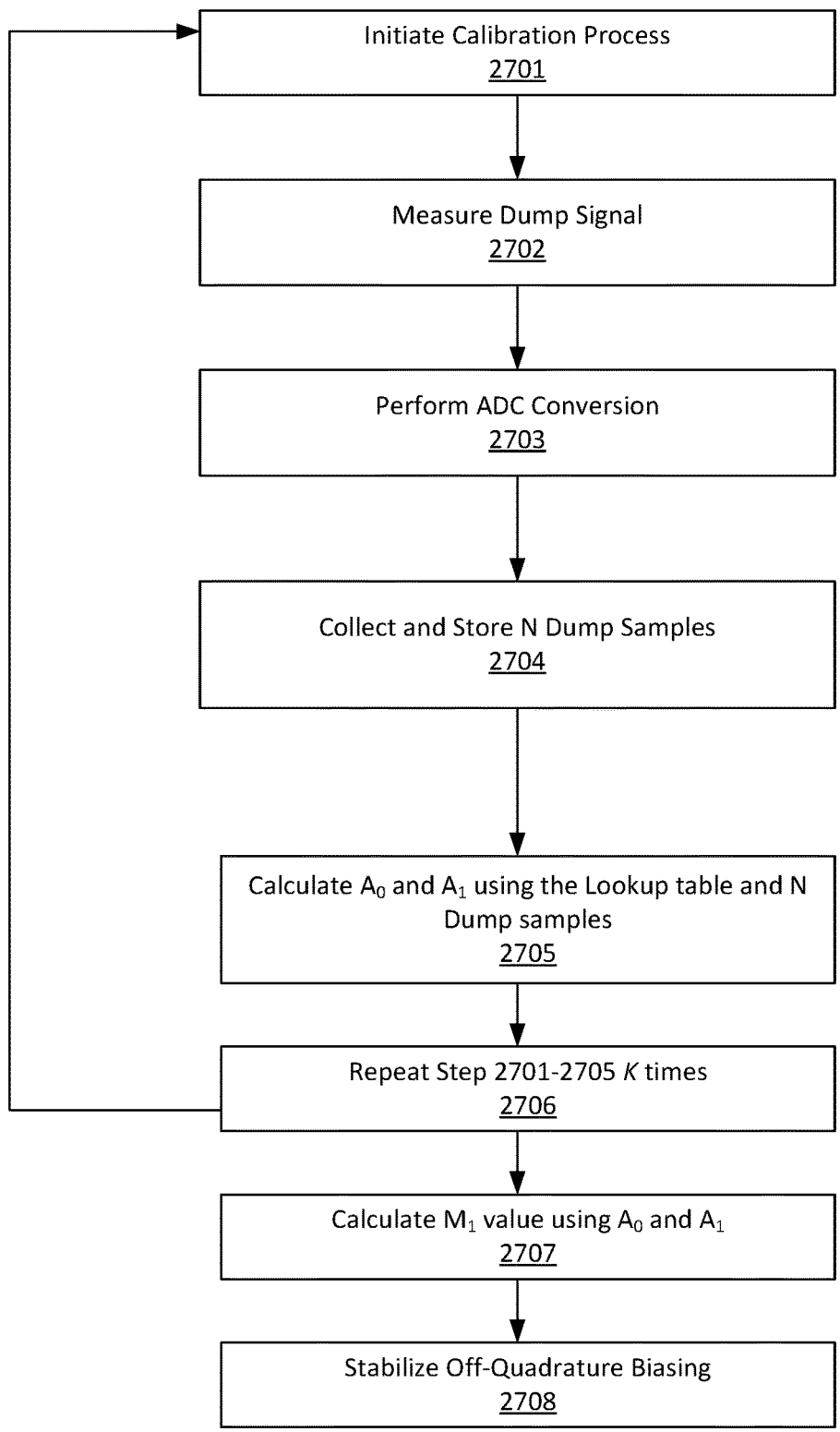
FIG. 27 is a simplified flow diagram illustrating a process for determining off-quadrature biasing parameters with lookup tables according to embodiments of the present invention.

FIG. 27 is a simplified flow diagram illustrating a process for determining off-quadrature biasing parameters with lookup tables according to embodiments of the present invention. This diagram is merely an example, which should not unduly limit the scope of the claims. One of ordinary skill in the art would recognize many variations, alternatives, and modifications. For example, one or more in FIG. 27 may be added, removed, repeated, replaced, modified, re-arranged, and/or overlapped, which should not unduly limit the scope of the claims. As an example, the process illustrated in FIG. 27 can be performed by system 2600 illustrated in FIG. 26. As shown in FIG. 27, a calibration process for providing off-quadrature biasing is initiated at step 2701. The calibration process is used to determine for an off-quadrature phase (e.g., 70 degrees), what is the corresponding M1 parameter as described above.

At step 2702, the dump signal (i.e., based on the output the MZM) is measured. For example, the dump signal an analog signal whose amplitude is measured. At step 2703, ADC conversion process performed. The ADC conversion process is performed at the predetermined fixed sample rate ($F_s$). As explained, the fixed sample rates $F_s$ corresponds to the entries of the lookup tables 2631 and 2632.

At step 2704, N dump samples are collected and stored into a buffer. For example, the buffer is implemented as a part of the MCU. At step 2705, parameters A0 and A1 are calculated. More specifically, $A_0$ is calculated by summing the dump sample values store at the buffer.

$A_1$ is calculated using both the dump sample values and the values stored at the lookup tables 2631 and 2632. For example, to calculate in-phase component $I_j$ and quadrature component $Q_j$, the following equations are used:

$$I_j = S_j \text{ sample}[j] \qquad \text{Equation 7:}$$

$$Q_j = C_j \text{ sample}[j] \qquad \text{Equation 8:}$$

In Equations 7 and 8, for j=1 ... N, each of the sample value "sample[j]" and its corresponding $S_j$ and $C_j$ values (stored at lookup tables 2631 and 2632 can calculated according to Equations 5 and 6) are used to calculated to corresponding $I_j$ and $Q_j$. To calculator parameter A1, Equation 9 below is used:

$$A_{1_j} = 2 * \sqrt{\Sigma I_j^2 + Q_j^2} \qquad \text{Equation 9:}$$

To get reliable result, steps 2706 repeats steps 2701 through 2705 K times so that average $A_0$ and $A_1$ can be used for calculating $M_1$.

At step 2707, parameter $M_1$ is calculated. More specifically, Equation 4 below is used to calculate parameter $M_1$:

$$M_1 = \frac{\sum A_{0_i}}{\sum A_{1_i}} \text{(wherein } i = 1 \ldots K) \qquad \text{Equation 4}$$

At step 2708, parameter $M_1$ is used as a control loop target for stabilizing off-quadrature biasing. For example, various types of control loop can be used to keep M1 stable, which translates to a stable off-quadrature biasing for the modulation. For example, phase trim signal from the MCU, DC power and the dither tone used for the MZM, and/or other variables may be used as an input value in the control loop to change parameter $M_1$ via the feedback control loop, where the input value is varied until parameter $M_1$ is stabilized and the corresponding off-quadrature positions are therefore achieved. Other input values (or "knob") can be used as well to adjust and stabilize parameter $M_1$ as well. Depending on the implementation, other types of control loop (e.g., PID, single-step, etc.) can be used as well.

According to various embodiments, an "$M_2$" parameter is used in lieu of parameter $M_1$. More specifically, $M_2$ parameter refers to the ratio of measured amplitude of the second harmonic of the tone to the measured amplitude of the fundamental. It is to be appreciated that by using the $M_2$ parameter for the bias calibration, DC errors in the photodiode voltage (e.g., due to dark current) can be substantially ignored. Since the amplitude of the second harmonic is small, the measured signal is amplified to allow for measurement.

Figure 28:
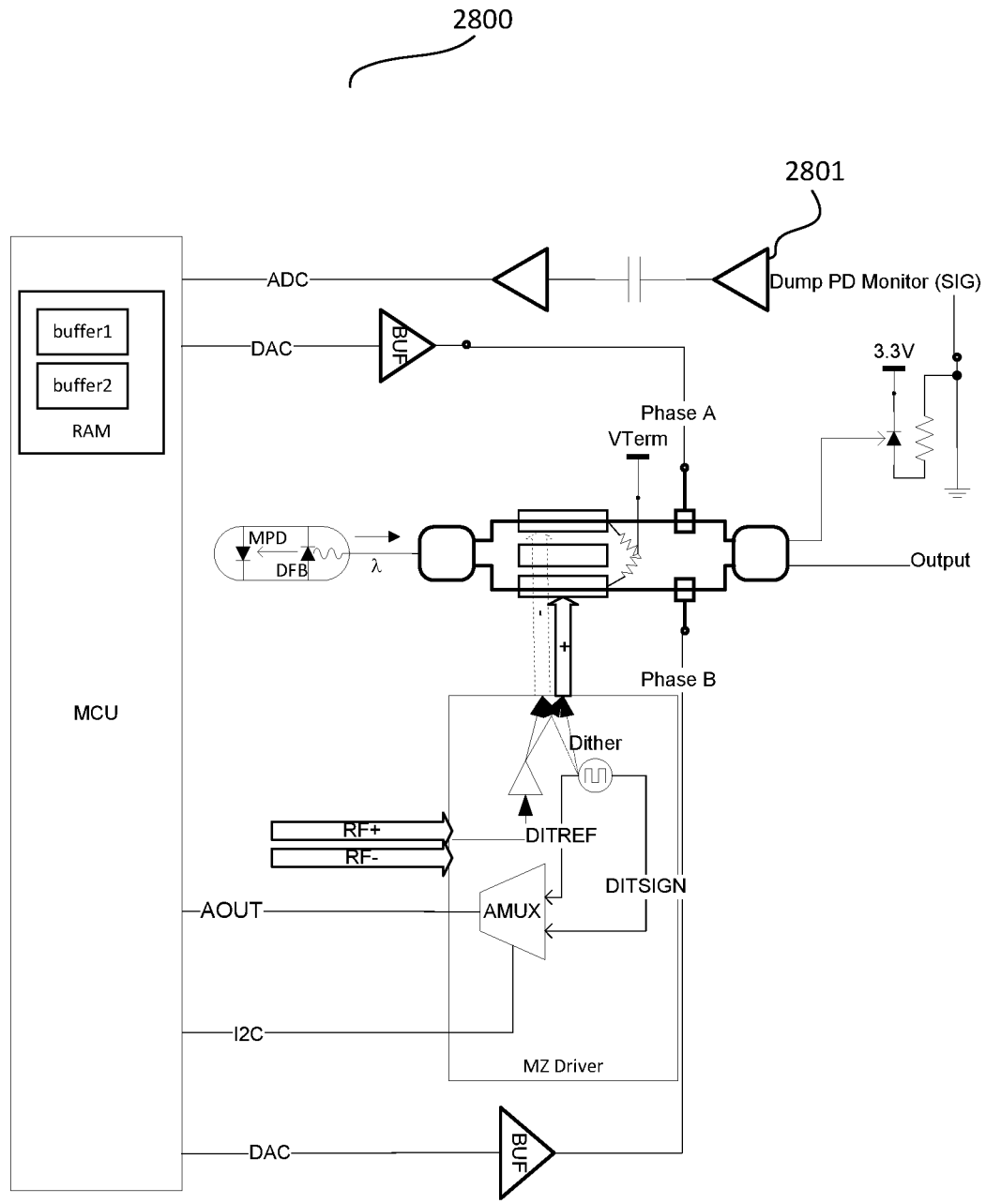
FIG. 28 is a simplified diagram illustrating an off-quadrature modulation system 2800 that uses $M_2$ parameter for bias calibration according to embodiments of the present invention.

FIG. 28 is a simplified diagram illustrating an off-quadrature modulation system 2800 that uses $M_2$ parameter for bias calibration according to embodiments of the present invention. This diagram is merely an example, which should not unduly limit the scope of the claims. One of ordinary skill in the art would recognize many variations, alternatives, and modifications. System 2800 shown shares many of the components as system 2400 in FIG. 24 and system 2600 in FIG. 26, with an addition of a transimpedance amplifier (TIA) 2801 that is coupled to the dump photo detector for the purpose of amplifier the amplitude of the second harmonic of the measured signal. In various embodiments, the TIA 2801 is AC coupled. The calibration process is substantially similar to the process 2500 illustrated in FIG. 25A, except that instead of measuring $A_0$, parameters $A_1$ and $A_2$ is measured.

As an example, the following process is performed for measuring $A_1$ and $A_2$ and determining $M_2$:

1. Generate an interrupt to the MCU on the rising edge of the DITSIGN signal;
2. Using the signal DITSIGN ISR that disables itself and starts an internal MCU timer. Timer length is determined to be the maximum length of time it can take to arrange all analog parameters to switch measurement to or from the reference signal.
3. While the timer is active, adjust any analog multiplexers as needed to change the ADC to be measuring reference signal DITREF.
4. Expiry of the timer signal generates an ISR signal.
5. Timer Expiry ISR starts an ADC conversion process at a fixed sample rate (e.g., $F_s$=100 KHz).
6. Collect N (e.g., 128) samples at $F_s$ into buffer1. For example, the number of samples N is predetermined for the calibration process.
7. Generate an interrupt to the MCU on the rising edge of the DITSIGN.
8. The DITSIGN ISR signal disables itself and starts an internal MCU timer. Timer length is determined to be the maximum length of time it can take to arrange all analog parameters to switch measurement to or from the reference signal.
9. While the timer is active, adjust analog multiplexers as needed to change the ADC to be measuring the SIG signal. For example, the SIG signal here is second harmonic of the measured amplified and is amplified by a TIA.
10. Expiry of the timer signal generates an ISR signal.
11. Timer Expiry ISR signal starts an ADC conversion process at a fixed sample rate (e.g. $F_s$=100 KHz). It the sample $F_s$ here matches the sample rate $F_s$ at step 5, as the sampling of reference signal DITREF needs to match the sampling of the measured signal SIG.
12. Collect N (e.g., 128) samples at $F_s$ into buffer2.
13. Calculate the dot product of buffer1 and buffer2. This is $A_{1_i}$. (note that we do not divide by N since a ratio will be taken later; we also ignore constant factors and the reference signal amplitude since the ratio will eliminate this as well).
14. Calculate the dot product of the first half of buffer2 with every other measurement in buffer1. This is $A_{2_i}$. (note that we do not divide by N since a ratio will be taken later). For example, Mathematically (ignoring the amplitude of the reference signal and constant factors), $A_{2_i}$ can be expresses using Equation 10 below:

$$A_{2_i} = 2\Sigma_{k=0}^{N/2} \text{buffer1}[2k] \times \text{buffer2}[k] \qquad \text{Equation 10:}$$

15. Repeat steps 1 to 14 K times for averaging purposes.
16. Calculate M2 using Equation 11 below:

$$M_2 = \frac{\sum A_{2_i}}{\sum A_{1_i}} \qquad \text{Equation 11}$$

17. Use parameter M2 as the target of a control loop. Possible control loops include PID, single-step, and/or others. As explained above, an objective of the control loop is to stabilize M2 at the desired value.

It is to be appreciated that the process described above is provided as an example, one or more steps may be added, removed, repeated, rearranged, modified, and/or overlapped, and they should limit the scope of claims.

In addition to determining $M_1$ and/or $M_2$ through calibration processes, as mentioned above, $M_1$ and $M_2$ can also be mathematically derived. To determine $M_1$, various system parameters are first determined. For example, independent of RF signal, the ADC voltage at the PD ($V_{PD}$) can be described using Equation 12 below:

$$V_{PD} = \frac{P_i}{2P_{loss}} R_s R_a \left(1 + \sin\left(\varphi_B + \pi \frac{A_d}{V_\pi} \sin(2\pi f_d t)\right)\right) \qquad \text{Equation 12}$$

Where $$\frac{P_i}{2P_{loss}}$$

represents the optical power minus losses, $R_s$ represents the sense resistor and $R_a$ represents the photodiode responsivity. Then, expanding the composite trigonometric function in terms of Bessel functions:

$$V_{PD} \cong \frac{P_i}{2P_{loss}} R_s \qquad \text{Equation 13}$$
$$R_a(A_0(\varphi_B) - A_1(\varphi_B)\sin(2\pi f_d t) + A_2(\varphi_B)\cos(2\pi f_d t) + \ldots)$$

Based on Equation 12 and Equation 13, $A_0$, $A_1$, and $A_2$ can be expressed as the following:

$$A_0(\varphi_B) = 1 + J_0\left(\pi \frac{A_d}{V_\pi}\right)\cos\varphi_B \qquad \text{Equation 14}$$

$$A_1(\varphi_B) = 2J_1\left(\pi \frac{A_d}{V_\pi}\right)\sin\varphi_B \qquad \text{Equation 15}$$

$$A_2(\varphi_B) = 2J_2\left(\pi \frac{A_d}{V_\pi}\right)\cos\varphi_B \qquad \text{Equation 16}$$

Parameters $M_1$ and $M_2$ can be expressed as below:

$$M_1(\varphi_B) = \frac{1 + J_0\left(\pi \frac{A_d}{V_\pi}\right)\cos\varphi_B}{2J_1\left(\pi \frac{A_d}{V_\pi}\right)\sin\varphi_B} \qquad \text{Equation 17}$$

$$M_2(\varphi_B) = \frac{J_2\left(\pi \frac{A_d}{V_\pi}\right)\cos\varphi_B}{J_1\left(\pi \frac{A_d}{V_\pi}\right)\sin\varphi_B}$$

Equation 18

For example, if the desired phase angle is already determined using system modeling, the dither amplitude and voltage $V_\pi$ are both well known, then this technique can be used instead of system calibration.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for operating an off-quadrature modulation system, the method comprising:
    selecting at least a first input value for performing an optical modulation process;
    generating a dither tone characterized by a first frequency;
    generating a dither tone signal in square-wave form;
    initiating a calibration process by interrupting a microcontroller unit using the dither tone signal;
    initiating a timer using the dither tone signal to track a first interval;
    coupling the dither tone signal with a RF signal to form a driver signal;
    performing the optical modulation process using the driver signal;
    generating a reference signal based on amplifying the dither tone signal;
    monitoring a dump signal based on an output of the optical modulation process by the microcontroller unit;
    obtaining N reference sample values during the first interval of K iterations by sampling the reference signal at a predetermined sampling rate;
    storing the N reference sample values at a first buffer;
    obtaining N measured sample values during a second interval of K iterations by sampling the dump signal at the predetermined sampling rate;
    storing the N measured sample values at a second buffer;
    calculating a first value by summing the N measured sample values;
    calculating a second value by determining multiple of a dot product between the N reference sample values and the N measured sample values;
    determining a first average value and a second average value by averaging the first values and the second values obtained over K iterations;
    calculating a ratio between the first average value and the second average value; and
    adjusting at least the first input value using the ratio as a target of a control loop.

2. The method of claim 1 wherein the dump signal comprises a second harmonic amplitude signal amplified by a TIA.

3. The method of claim 1 wherein the second value is determined by multiplying two to the dot product between the N reference sample values and the N measured sample values.

4. The method of claim 1 wherein the predetermined sampling rate is greater than a frequency of the dither tone signal.

5. The method of claim 1 further comprising performing analog to digital conversion for the dump signal to obtain the N measured sample values.

6. The method of claim 1 wherein the first input value is associated with a phase trim adjustment signal generated by the microcontroller unit.

7. The method of claim 1 wherein the control loop comprises a proportional-integral-derivative (PID) controller.

8. The method of claim 1 further comprising performing phase trimming by an optical modulator.

9. The method of claim 1 further where N is greater than 100.

10. An off-quadrature biased optical modulation system comprising:
    a driver module comprising a dither tone generator, the driver module being configured to output a reference dither tone signal and a driving signal, the driving signal including an RF component and a dither tone component;
    a light source;
    an optical modulator being configured to generate a modulated light signal and a dump signal using the light source and the driving signal;
    an analog to digital converter (ADC) being configured to sample the reference dither tone signal during a first time interval to generate N reference samples and to sample the dump signal during a second interval to generate N dump samples;
    a first buffer being configured to store the N reference samples;
    a second buffer being configured to store N dump samples;
    a microcontroller unit being configured to calculate a ratio based at least on the N reference samples and the N dump samples; and
    a control module being configured to stabilize the optical modulator at off-quadrature positions using at least the ratio.

11. The system of claim 10 further comprising a TIA for amplifying the dump signal, the N dump samples being based on second harmonic amplitude of the dump signal.

12. The system of claim 10 wherein the control module comprises a PID control loop.

13. The system of claim 10 further comprising an RF source coupled to the driver module.

14. The system of claim 10 wherein the microcontroller unit is configured to provide phase trim signals to adjust the modulated light signal.

15. The system of claim 10 wherein the driver module further comprises an analog multiplexer for selecting between an amplifier dither tone signal and a square dither tone signal.

16. The system of claim 10 wherein the microcontroller unit comprises a time for tracking the first interval and the second interval.

17. An off-quadrature biased optical modulation system comprising:
    a driver module comprising a dither tone generator, the driver module being configured to output a dither tone signal and a driving signal, the driving signal including an RF signal and the dither tone signal, the dither tone signal being characterized by a dither frequency;
    a light source;
    an optical modulator being configured to generate a modulated light signal and a dump signal using the light source and the driving signal;

an analog to digital converter (ADC) being configured to sample the dump signal to generate N dump samples;

a buffer being configured to store N dump samples;

a memory for storing a lookup tables for storing dither values;

a microcontroller unit being configured to calculate a ratio based on the dither values and the N dump samples; and a control module being configured to stabilize the optical modulator at off-quadrature positions using at least the ratio.

18. The device of claim 17 wherein the dither values are calculated using sine and cosine functions of the dither frequency.

19. The device of claim 17 wherein the microcontroller unit comprises a clock signal generator for providing a clock signal, the clock signal being used by the driver to generate the dither tone signal.

20. The device of claim 17 wherein the microcontroller unit comprises a random-access memory.

* * * * *